(12) United States Patent
Chen et al.

(10) Patent No.: US 11,195,810 B2
(45) Date of Patent: Dec. 7, 2021

(54) BONDING STRUCTURE AND METHOD OF FORMING SAME

(71) Applicant: Taiwan Semiconductor Manufacturing Company, Ltd., Hsinchu (TW)

(72) Inventors: Hsien-Wei Chen, Hsinchu (TW); Jie Chen, New Taipei (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/549,004

(22) Filed: Aug. 23, 2019

(65) Prior Publication Data

US 2021/0057363 A1 Feb. 25, 2021

(51) Int. Cl.
| | |
|---|---|
| *H01L 23/00* | (2006.01) |
| *H01L 23/48* | (2006.01) |
| *H01L 23/532* | (2006.01) |
| *H01L 21/768* | (2006.01) |
| *H01L 21/18* | (2006.01) |
| *H01L 33/00* | (2010.01) |
| *H01L 23/373* | (2006.01) |

(52) U.S. Cl.
CPC ............ *H01L 24/09* (2013.01); *H01L 21/187* (2013.01); *H01L 21/76807* (2013.01); *H01L 21/76871* (2013.01); *H01L 23/481* (2013.01); *H01L 23/53238* (2013.01); *H01L 24/03* (2013.01); *H01L 23/3735* (2013.01); *H01L 33/0093* (2020.05); *H01L 2224/02331* (2013.01); *H01L 2224/02372* (2013.01); *H01L 2924/01013* (2013.01)

(58) Field of Classification Search
CPC ............... H01L 21/187; H01L 33/0093; H01L 23/3735; H01L 24/09
See application file for complete search history.

(56) References Cited

U.S. PATENT DOCUMENTS

| | | | |
|---|---|---|---|
| 6,265,315 B1 | 7/2001 | Lee et al. | |
| 6,596,640 B1 * | 7/2003 | Fishcer | H01L 25/0657 438/692 |
| 7,354,862 B2 * | 4/2008 | Wong | H01L 23/3157 438/692 |
| 7,897,481 B2 * | 3/2011 | Chiou | H01L 25/0657 438/455 |

(Continued)

FOREIGN PATENT DOCUMENTS

| | | |
|---|---|---|
| KR | 20140112442 A | 9/2014 |
| KR | 20150073930 A | 7/2015 |

(Continued)

*Primary Examiner* — David A Zarneke

(74) *Attorney, Agent, or Firm* — Slater Matsil, LLP

(57) ABSTRACT

A device includes an interconnect structure over a substrate, multiple first conductive pads over and connected to the interconnect structure, a planarization stop layer extending over the sidewalls and top surfaces of the first conductive pads of the multiple first conductive pads, a surface dielectric layer extending over the planarization stop layer, and multiple first bonding pads within the surface dielectric layer and connected to the multiple first conductive pads.

20 Claims, 28 Drawing Sheets

(56) References Cited

U.S. PATENT DOCUMENTS

| | | | |
|---|---|---|---|
| 8,791,549 B2 * | 7/2014 | Chen | H01L 21/76877 |
| | | | 257/621 |
| 8,841,777 B2 * | 9/2014 | Farooq | H01L 21/2007 |
| | | | 257/777 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,157,867 B1 | 12/2018 | Chen et al. | |
| 10,276,691 B2 * | 4/2019 | Yeong | H01L 21/225 |
| 10,672,820 B2 * | 6/2020 | Tsai | H01L 27/14632 |
| 10,790,189 B2 * | 9/2020 | Kuang | H01L 23/291 |
| 10,886,249 B2 * | 1/2021 | Hofrichter | H01L 24/08 |
| 2004/0046230 A1 | 3/2004 | Bernstein et al. | |
| 2011/0272664 A1 | 11/2011 | Tada et al. | |
| 2014/0264830 A1 | 9/2014 | Teh et al. | |
| 2017/0186715 A1 | 6/2017 | Yu et al. | |

FOREIGN PATENT DOCUMENTS

| | | |
|---|---|---|
| KR | 20170077758 A | 7/2017 |
| TW | 201913945 A | 4/2019 |
| WO | 2010079816 A1 | 7/2010 |

* cited by examiner

BONDING STRUCTURE AND METHOD OF FORMING SAME

BACKGROUND

In wafer-to-wafer bonding technology, various methods have been developed to bond two package components (such as wafers) together. Some wafer bonding methods include fusion bonding, eutectic bonding, direct metal bonding, hybrid bonding, and the like. In fusion bonding, an oxide surface of a wafer is bonded to an oxide surface or a silicon surface of another wafer. In eutectic bonding, two eutectic materials are placed together, and a high pressure and a high temperature are applied. The eutectic materials are hence melted. When the melted eutectic materials solidify, the wafers bond together. In direct metal-to-metal bonding, two metal pads are pressed against each other at an elevated temperature, and the inter-diffusion of the metal pads causes the bonding of the metal pads. In hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
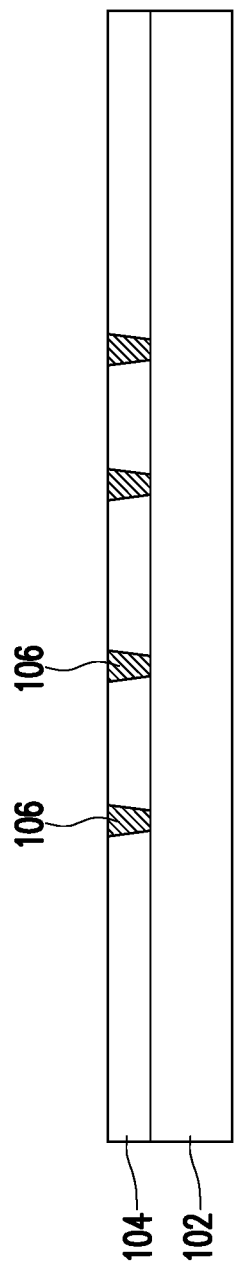
FIGS. 1-11 illustrate cross-sectional views of intermediate steps in a process for forming a device structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A bonding structure and method is provided, in accordance with some embodiments. A surface dielectric layer is formed over an interconnect structure, and bonding pads are formed in the surface dielectric layer. Through the use of a planarization stop layer, the thickness of the surface dielectric layer can be reduced. This can provide increased thermal conduction across the surface dielectric layer, which can allow for improved device performance at higher temperatures. Additionally, the overall size of the device may be reduced due to the thinner surface dielectric layer.

FIGS. 1-12 illustrate cross-sectional views of intermediate stages in the formation of a device structure 100, in accordance with some embodiments. FIG. 1 illustrates a substrate 102 and features formed over the substrate 102, in accordance with some embodiments. The substrate 102 may be a semiconductor substrate, such as a bulk semiconductor, a semiconductor-on-insulator (SOI) substrate, a semiconductor wafer, or the like, which may be doped (e.g., with a p-type or an n-type dopant) or undoped. Generally, a SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 102 and features formed thereon are used to form a device die. In such embodiments, integrated circuit devices may be formed on the top surface of the substrate 102. Exemplary integrated circuit devices may include complementary metal-oxide semiconductor (CMOS) transistors, fin field-effect transistors (FinFETs), resistors, capacitors, diodes, the like, or a combination thereof. The details of the integrated circuit devices are not illustrated herein. In some embodiments, the substrate 102 is used for forming an interposer structure. In such embodiments, no active devices such as transistors or diodes are formed on the substrate 102. Passive devices such as capacitors, resistors, inductors, or the like may be formed in the substrate 102. The substrate 102 may also be a dielectric substrate in some embodiments in which the substrate 102 is part of an interposer structure. In some embodiments, through vias (not shown) may be formed extending through the substrate 102 in order to interconnect components on the opposite sides of the substrate 102.

In FIG. 1, a dielectric layer 104 is formed over the substrate 102. The dielectric layer 104 may include one or more layers comprising one or more materials. In embodiments where integrated circuit devices are formed on the substrate 102, the dielectric layer 104 may fill the spaces between the gate stacks of transistors (not shown) of the integrated circuit devices. In some embodiments, the dielectric layer 104 may be an inter-layer dielectric (ILD) layer. The dielectric layer 104 may be formed from phosphosilicate glass (PSG), borosilicate glass (BSG), boron-doped phosphosilicate glass (BPSG), fluorine-doped silicate glass (FSG), tetraethyl orthosilicate (TEOS), the like, or a combination thereof. In some embodiments, the dielectric layer 104 may include a layer formed from a low-k dielectric material having a k-value lower than about 3.0. In some embodiments, the dielectric layer 104 is formed using a spin-coating process or formed using a deposition method such as plasma enhanced chemical vapor deposition (PECVD), flowable chemical vapor deposition (FCVD), low pressure chemical vapor deposition (LPCVD), or the like.

Further in FIG. 1, contact plugs 106 are formed in the dielectric layer 104. The contact plugs 106 are electrically connected to the integrated circuit devices of the substrate 102. For example, the contact plugs 106 may be gate contact plugs that are connected to the gate electrodes of transistors (not shown) of the integrated circuit devices, and/or may be source/drain contact plugs that are electrically connected to the source/drain regions of the transistors. After forming the dielectric layer 104, openings for the contact plugs 106 are formed through the dielectric layer 104. The openings may be formed using acceptable photolithography and etching techniques. For example, a photoresist may be formed over the dielectric layer and patterned, and the openings in the dielectric layer 104 formed by etching the dielectric layer 104 using the patterned photoresist as an etching mask. The dielectric layer 104 may be etched using a suitable wet etching process, dry etching process, or a combination thereof. In some embodiments, a liner such as a diffusion barrier layer, an adhesion layer, or the like may be formed in the openings, and a conductive material may then be formed in the openings over the liner. The liner may include titanium, titanium nitride, tantalum, tantalum nitride, the like, or a combination thereof. The conductive material may include cobalt, copper, a copper alloy, silver, gold, tungsten, aluminum, nickel, the like, or a combination thereof. After forming the conductive material, a planarization process, such as a grinding process, a chemical-mechanical polish (CMP) process, or the like may be performed to remove excess material from a surface of dielectric layer 104. The remaining liner and conductive material thus form the contact plugs 106.

Figure 2:
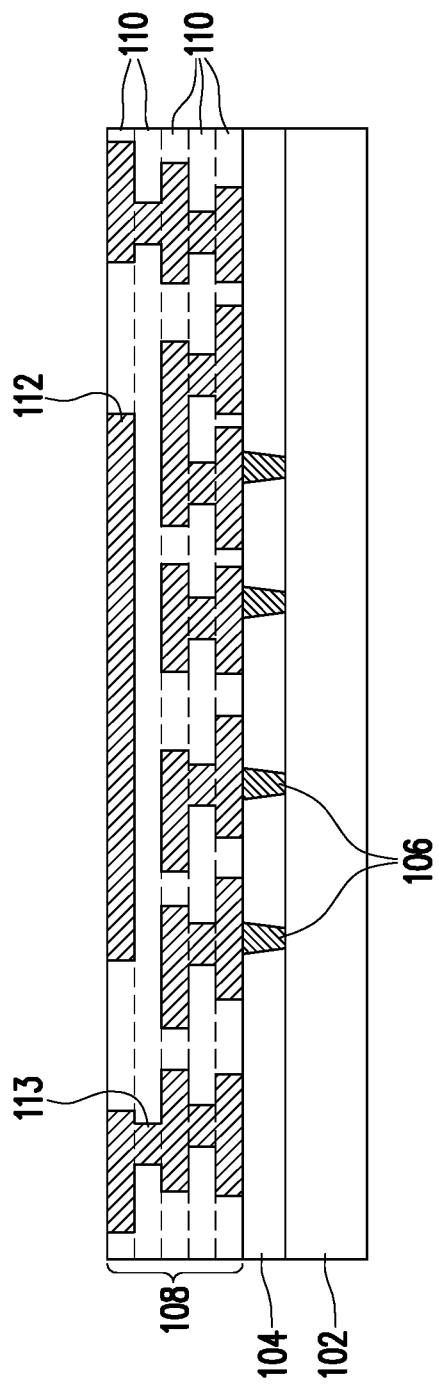

In FIG. 2, an interconnect structure 108 is formed over the contact plugs 106 and the dielectric layer 104, in accordance with some embodiments. The interconnect structure 108 provides routing and electrical connections between devices formed in the substrate 102, and may be a redistribution structure. The interconnect structure 108 may include a plurality of insulating layers 110, which may be inter-metal dielectric (IMD) layers. Each of the insulating layers 110 includes one or more metal lines 112 and/or vias 113 formed therein. The metal lines 112 and vias 113 may be electrically connected to the active and/or passive devices of the substrate 102 by the contact plugs 106. The metal lines 112 may be, for example, redistribution layers.

In some embodiments, the insulating layers 110 may be formed from a low-k dielectric material having a k-value lower than about 3.0. The insulating layers 110 may be formed from an extra-low-k (ELK) dielectric material having a k-value of less than 2.5. In some embodiments, the insulating layers 110 may be formed from an oxygen-containing and/or carbon containing low-k dielectric material, Hydrogen SilsesQuioxane (HSQ), MethylSilsesQuioxane (MSQ), the like, or a combination thereof. In some embodiments, some or all of insulating layers 110 are formed of non-low-k dielectric materials such as silicon oxide, silicon carbide (SiC), silicon carbonitride (SiCN), silicon oxycarbonitride (SiOCN), or the like. In some embodiments, etch stop layers (not shown), which may be formed of silicon carbide, silicon nitride, or the like, are formed between insulating layers 110. In some embodiments, the IMD layers 110 are formed from a porous material such as SiOCN, SiCN, SiOC, SiOCH, or the like, and may be formed by spin-on coating or a deposition process such as plasma enhanced chemical vapor deposition (PECVD), CVD, PVD, or the like. In some embodiments, the interconnect structure 108 may include one or more other types of layers, such as diffusion barrier layers (not shown).

In some embodiments, the interconnect structure 108 may be formed using a single and/or a dual damascene process, a via-first process, or a metal-first process. In an embodiment, an insulating layer 110 is formed, and openings (not shown) are formed therein using acceptable photolithography and etching techniques. Diffusion barrier layers (not shown) may be formed in the openings and may include a material such as TaN, Ta, TiN, Ti, CoW, or the like, and may be formed in the openings by a deposition process such as CVD, ALD, or the like. A conductive material may be formed in the openings from copper, aluminum, nickel, tungsten, cobalt, silver, combinations thereof, or the like, and may be formed over the diffusion barrier layers in the openings by an electro-chemical plating process, CVD, ALD, PVD, the like, or a combination thereof. After formation of the conductive material, excess conductive material may be removed using, for example, a planarization process such as CMP, thereby leaving metal lines 112 in the openings of the bottommost IMD layer 110. The process may then be repeated to form additional insulating layers 110 and metal lines 112 and vias 113 therein. In some embodiments, the topmost insulating layer 110 and the metal lines 112 formed therein may be formed having a thickness greater than a thickness of the other insulating layers 110 of the interconnect structure 108. In some embodiments, one or more of the topmost metal lines 112 are dummy lines that are electrically isolated from the substrate 102.

Figure 3:
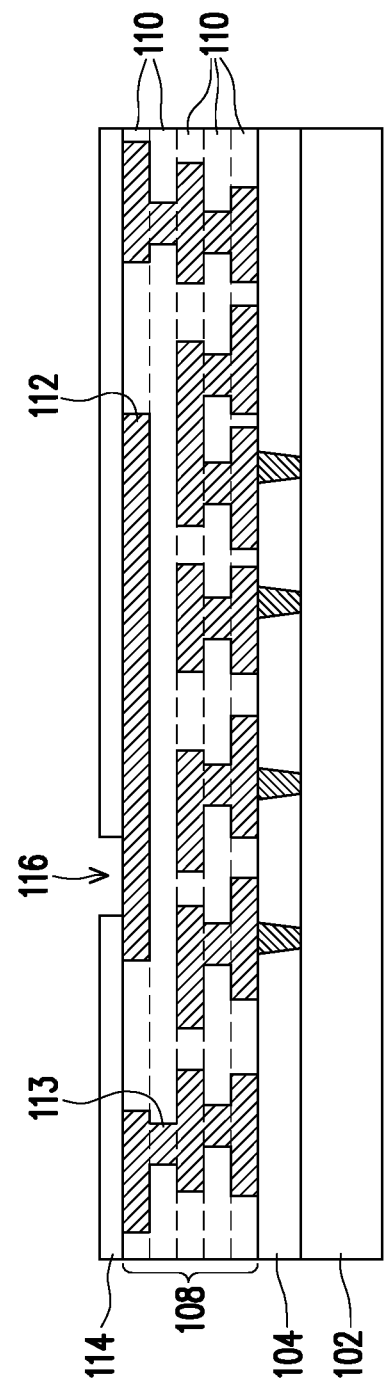

In FIG. 3, a passivation layer 114 is formed over the interconnect structure 108, and one or more openings 116 are formed in the passivation layer 114. The passivation layer 114 may comprise one or more layers of one or more materials. For example, the passivation layer 114 may include one or more layers of silicon nitride, silicon oxide, silicon oxynitride, the like, or a combination. The passivation layer 114 may be formed by a suitable process such as CVD, PECVD, PVD, ALD, the like, or a combination thereof. The passivation layer 114 may be formed having a thickness greater than a thickness of the topmost insulating layer 110.

The openings 116 in the passivation layer 114 may be formed using a suitable photolithographic and etching process. For example, a photoresist may be formed over the passivation layer 114 and patterned, and then the patterned photoresist may be used as an etching mask. The passivation layer 114 may be etched using a suitable wet etching process and/or dry etching process. The openings 116 are formed to expose portions of the metal layer 112 (e.g., the topmost metal line 112 of the interconnect structure 108) for electrical connection.

Figure 4:
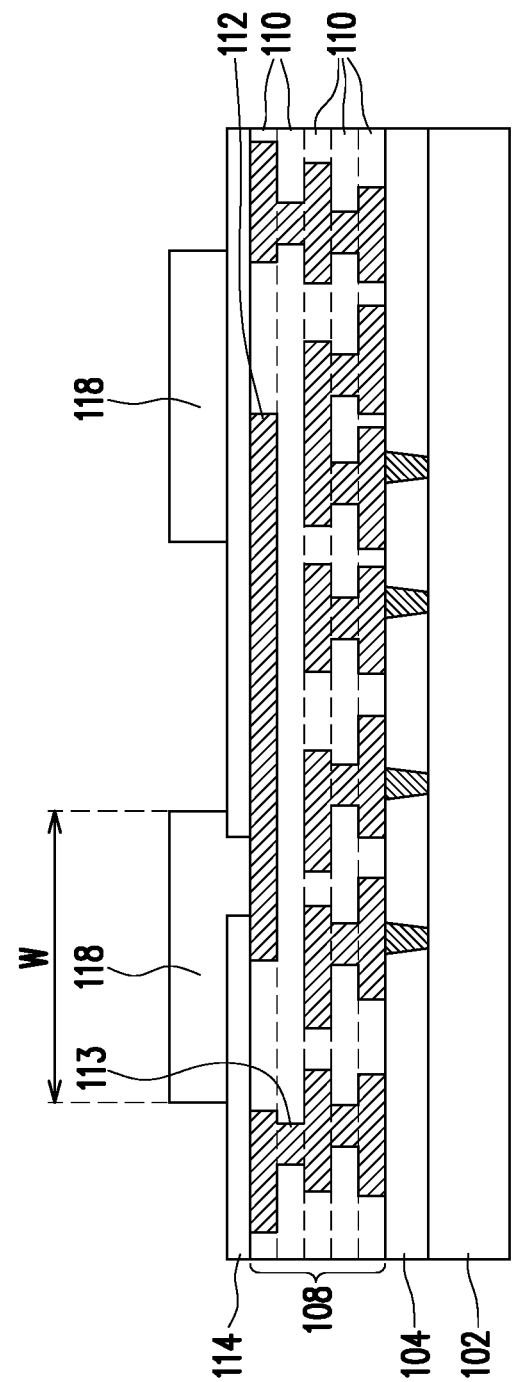

In FIG. 4, conductive pads 118 are formed over the passivation layer 114 in accordance with some embodiments. One or more conductive pads 118 may be formed extending through the openings 116 and make electrical connection with one or more of the topmost metal lines 112 of the interconnect structure 108. In some embodiments, the conductive pads 118 are formed by first forming a seed layer over the passivation layer 114 and the openings 116. In some embodiments, the seed layer is a metal layer comprising one or more layers, which may be formed of different materials. The seed layer may be formed using, for example, physical vapor deposition (PVD) or the like. A photoresist is formed and patterned on the seed layer and conductive material is formed in the openings of the photoresist and on the exposed portions of the seed layer. In some embodiments, the conductive material may be formed by a plating process, such as using an electroplating or electroless plating process, or the like. The conductive material may include one or more materials such as copper, titanium, tungsten, gold, cobalt, aluminum, the like, or a combination thereof. The photoresist and portions of the seed layer on which the conductive material is not formed are then removed using, for example, a suitable ashing or stripping process, such as using an oxygen plasma or the like. Once the photoresist is removed, remaining exposed portions of the seed layer may be removed using an acceptable etching process, such as a wet etching process or a dry etching process. The remaining portions of the seed layer and conductive material form the conductive pads 118.

In some embodiments, the conductive pads 118 may be formed by first depositing a blanket layer of a conductive material. For example, CVD, PVD, or the like may be used to deposit a layer of aluminum over the over the passivation layer 114 and the openings 116, and over the metal line 112. A photoresist layer (not separately illustrated) may then be formed over the aluminum layer and the aluminum layer may be etched to form the conductive pads 118. The conductive pads 118 may be formed using other techniques in other embodiments, and all such techniques are considered within the scope of this disclosure.

In some embodiments, the conductive pads 118 that are electrically connected to the interconnect structure 108 may be used as test pads before additional processing steps are performed. For example, the conductive pads 118 may be probed as part of a wafer-acceptance-test, a circuit test, a Known Good Die (KGD) test, or the like. The probing may be performed to verify the functionality of the active or passive devices of the substrate 102 or the respective electrical connections within the substrate 102 or interconnect structure 108 (e.g., the metal lines 112 or the vias 113). The probing may be performed by contacting a probe needle (not shown) to the conductive pads 118. The probe needle may be a part of a probe card that includes multiple probe needles which, for example, may be connected to testing equipment.

In some embodiments, the conductive material of the conductive pads 118 may be different than the conductive material of the metal lines 112. For example, the conductive pads 118 may be aluminum and the metal lines 112 may be copper, though other conductive materials may be used. In some embodiments, the conductive pads 118 may have a width W between about 2 μm and about 30 μm or a length (e.g., perpendicular to the width) between about 20 μm and about 100 μm. In some embodiments, the conductive pads 118 may have a thickness between about 500 nm and about 3000 nm. In some cases, a thicker conductive pad 118 may have less risk of becoming damaged when being probed. As such, the conductive pads 118 may have a greater thickness than the metal lines 112. To reduce the chance of damage during probing, the conductive pads 118 may also be formed of a conductive material (e.g., aluminum) that is less soft than the conductive material (e.g., copper) of the metal lines 112. The embodiments described in the present disclosure may allow for a greater thickness of conductive pads 118 to be used without increasing the overall thickness of the structure (e.g., device structure 100).

Figure 5:
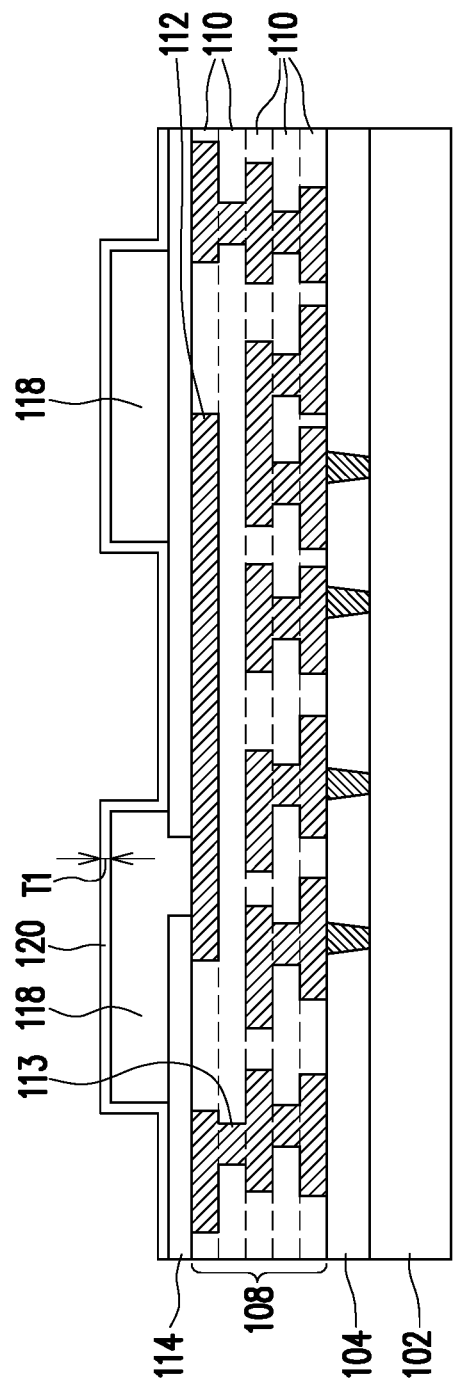

Turning to FIG. 5, a first stop layer 120 is formed over the conductive pads 118 and the passivation layer 114, in accordance with some embodiments. In some embodiments, the first stop layer 120 may be used as a stop layer for a subsequent CMP process (see FIG. 7). The first stop layer 120 may comprise a dielectric material such as silicon carbide, silicon oxycarbide, silicon nitride, silicon oxide, the like, or a combination thereof. The first stop layer 120 may be formed using a process such as CVD, PVD, ALD, or the like. The first stop layer 120 is deposited over the top surfaces of the conductive pads 118, and may be deposited conformally over the top surfaces of the passivation layer 114 and the conductive pads 118 and over the sidewalls of the conductive pads 118. In some embodiments, the first stop layer 120 may be formed having a thickness T1 that is between about 300 Å and about 1500 Å. The first stop layer 120 may be formed to a thickness suitable to stop or slow the planarization process described below in FIG. 7. In some cases, a thicker first stop layer 120 may be used to avoid exposing the conductive pads 118 during the planarization process described below. In some embodiments, the first stop layer 120 is also used as an etch stop (see e.g., FIGS. 10 and 16), and the thickness of the first stop layer 120 may be chosen such that a sufficient thickness of the first stop layer 120 remains after planarization to act as an etch stop.

Figure 6:
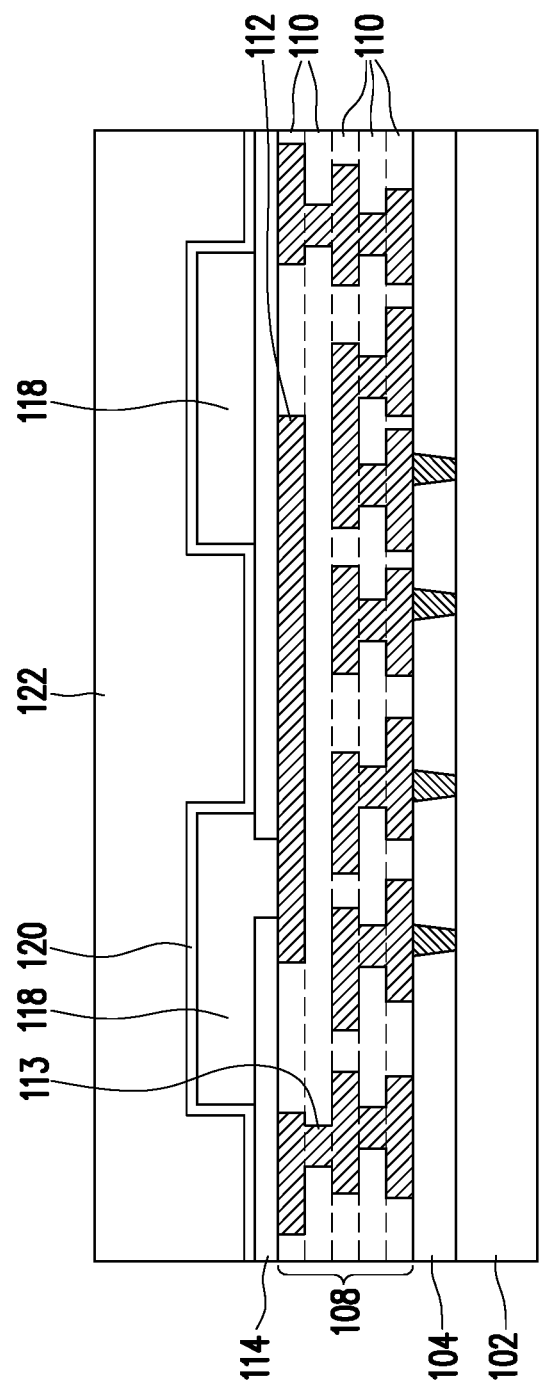

Turning to FIG. 6, a dielectric layer 122 is formed over the first stop layer 120. The dielectric layer 122 may be formed from one or more layers of one or more dielectric materials, such as silicon oxide, silicon nitride, SiOCH, SiCH, the like, or a combination thereof. The dielectric layer 122 may be formed by a deposition process such as CVD, PECVD, PVD, ALD, the like, or a combination thereof. In some embodiments, the dielectric layer 122 and the first stop layer 120 are made of different dielectric materials. The dielectric layer 122 may be formed to have a thickness greater than a thickness of the conductive pads 118 so that the material of the dielectric layer 122 laterally surrounds the conductive pads 118, and so that the dielectric layer 122 may be planarized (see below) without exposing the conductive pads 118.

Figure 7:
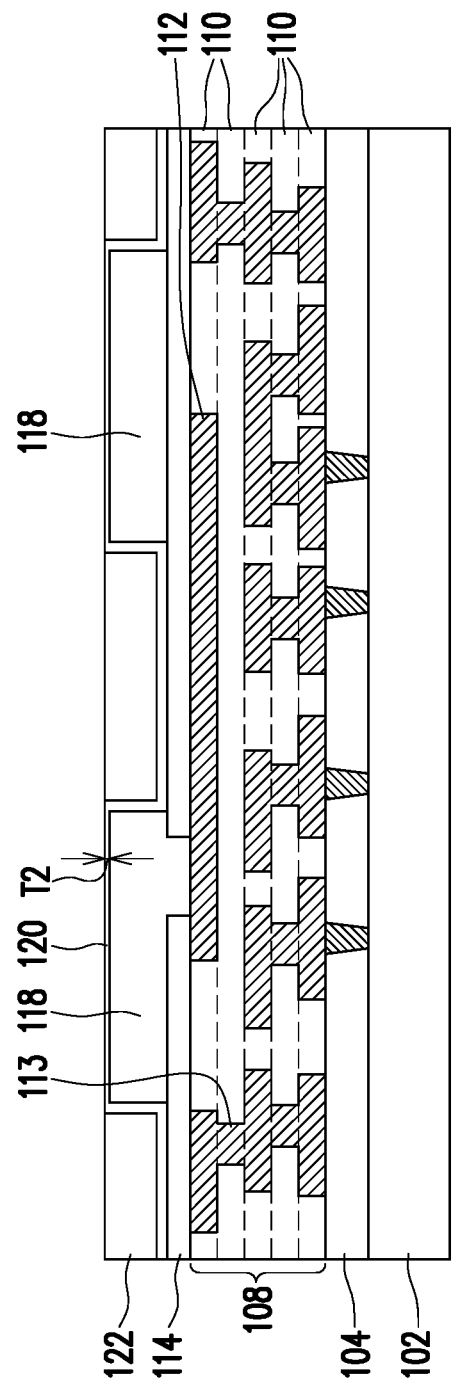

In FIG. 7, a planarization process is performed on the dielectric layer 122. The planarization process may be, for example, a CMP process. The first stop layer 120 is used to stop or slow the planarization process near the top surfaces of the conductive pads 118. As shown in FIG. 7, a portion of the first stop layer 120 may remain over the top surfaces of the conductive pads 118 after the planarization process has been performed. In some embodiments, the thickness T2 of the first stop layer 120 that remains on the conductive pads 118 may be between about 100 Å and about 300 Å, such as about between about 50 Å and about 150 Å. In some embodiments, the ratio of T1 to T2 may be between about 3 to 1 and about 50 to 1. The thickness T2 of the remaining first stop layer 120 may be thick enough to protect the conductive pads 118. In some cases, a smaller thickness T2 allows for a smaller overall distance between the conductive pads 118 and the top surface of the surface dielectric layer 126 (see e.g., FIG. 17), which can improve thermal conductivity and reduce capacitance effects in the final device. In some embodiments a portion of the first stop layer 120 may be left remaining on the conductive pads 118 in order to be subsequently used as an etch stop (see e.g., FIG. 10). In some embodiments, the planarization process may be controlled such that the thickness T2 of the remaining first stop layer 120 may be sufficient to act as an etch stop.

Figure 8:
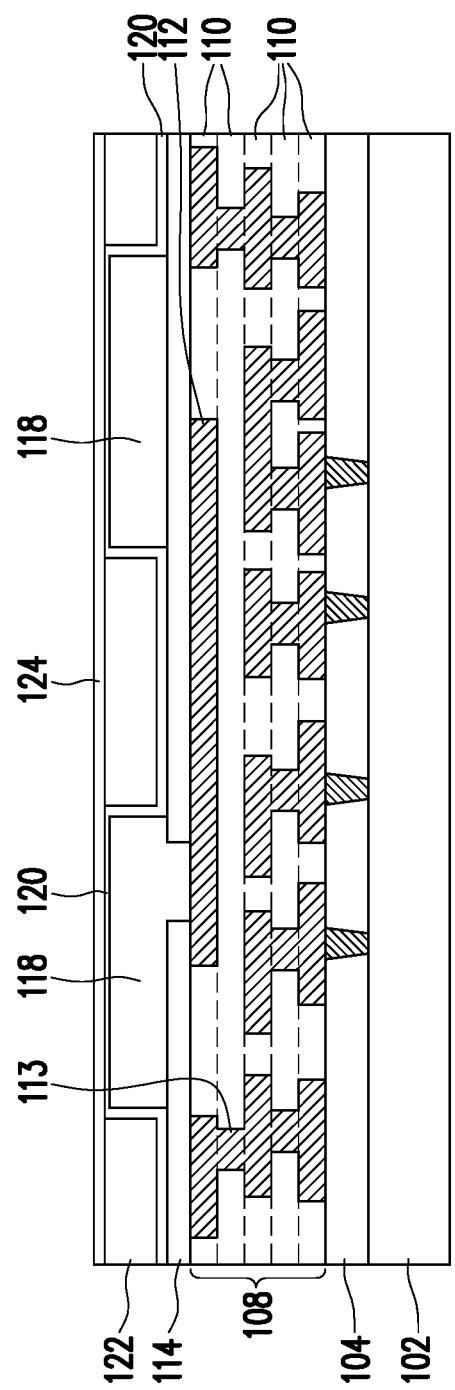

Turning to FIG. 8, a second stop layer 124 is formed over the dielectric layer 122 and the first stop layer 120. The second stop layer 124 may be subsequently used as an etch stop layer (see FIG. 10). In some embodiments, the second stop layer 124 is the same material as the first stop layer 120, but the first stop layer 120 and the second stop layer 124 may be different materials in other embodiments. The second stop layer 124 may comprise a material such as silicon carbide, silicon oxycarbide, silicon nitride, silicon oxide, the like, or a combination thereof. The second stop layer 124 may be formed using a process such as CVD, PVD, ALD, or the like. In some cases, the use of a second stop layer 124 may improve planarity of the surface of the second stop layer 124 and the planarity of surfaces during subsequent process steps. In some embodiments, the second stop layer 124 may be formed having a thickness that is between about 150 Å and about 1500 Å, such as about 300 Å. In some embodiments, the thickness of the second stop layer 124 may be sufficient to act as an etch stop (see e.g., FIG. 10). In some cases, a thicker second stop layer 124 may improve planarity of the surface of the second stop layer 124 and of subsequently formed features.

Figure 9:
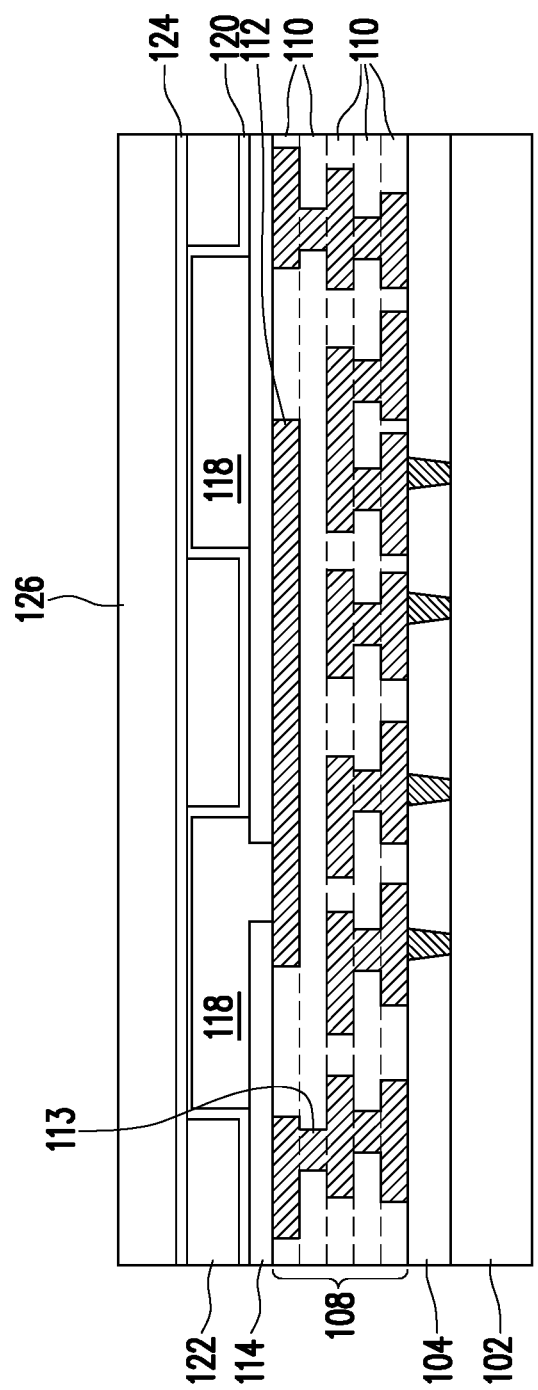

Turning to FIG. 9, a surface dielectric layer 126 is formed over the second stop layer 124. The surface dielectric layer 126 may be formed from one or more layers of one or more dielectric materials, and may comprise a silicon-containing material such as silicon oxide, silicon oxynitride, silicon nitride, or the like. In some embodiments, the surface dielectric layer 126 and the second stop layer 124 are made of different dielectric materials. The surface dielectric layer 126 may be formed by a deposition process such as CVD, PECVD, PVD, ALD, the like, or a combination thereof. In an embodiment, the surface dielectric layer 126 comprises silicon oxide, and may alternatively be referred to as a "bonding oxide."

Figure 10:
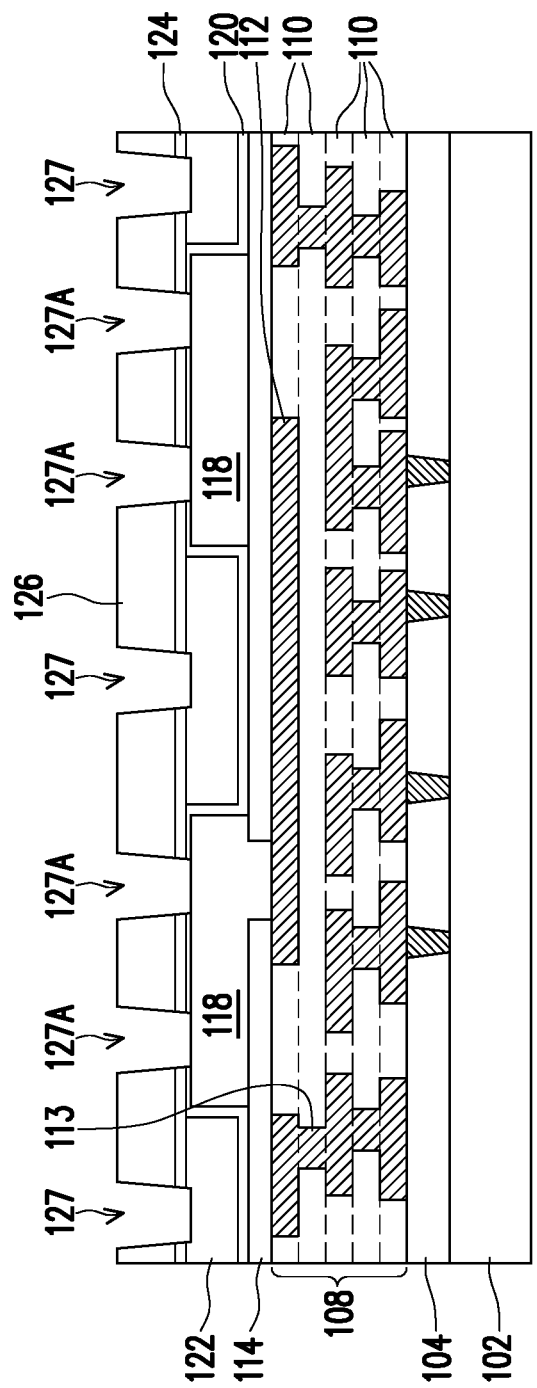

In FIG. 10, openings 127 are formed in the surface dielectric layer 126, in accordance with some embodiments. The openings 127 may be formed using acceptable photolithography and etching techniques. For example, the photolithography process may include forming a photoresist (not shown) over the surface dielectric layer 126, patterning the photoresist with openings corresponding to the openings 127, extending the pad openings 127 through the photoresist and into the surface dielectric layer 126, and then removing the photoresist. The photoresist may be a single-layer photoresist, a bi-layer photoresist, a tri-layer photoresist, or the like. The etching process is performed such that the etch stops on the second stop layer 124. An additional etching process may be performed to extend the openings 127 through the second stop layer 124. In some regions in which the second stop layer 124 is on the first stop layer 120, the openings 127 may be extended through both the second stop layer 124 and the first stop layer 120. For example, in regions over the conductive pads 118, the openings 127 may extend through both the second stop layer 124 and the first stop layer 120 to expose top surfaces of the conductive pads 118. Example openings that extend through both the second stop layer 124 and the first stop layer 120 are designated in FIG. 10 as openings 127A. In some embodiments, the openings 127 may have a width between about 1 μm and about 5 μm, although other widths are possible. In some embodiments, the openings 127 may have a tapered profile, such as having a bottom width between about 1 μm and about 2 μm and a top width between about 2 μm and about 5 μm. In some cases, the width of the openings 127A may be between about 10% and about 100% of the width W of the conductive pad 118. In this manner, the width of the openings 127A may be such that multiple openings 127A may be formed over a single conductive pad 118.

Figure 11:
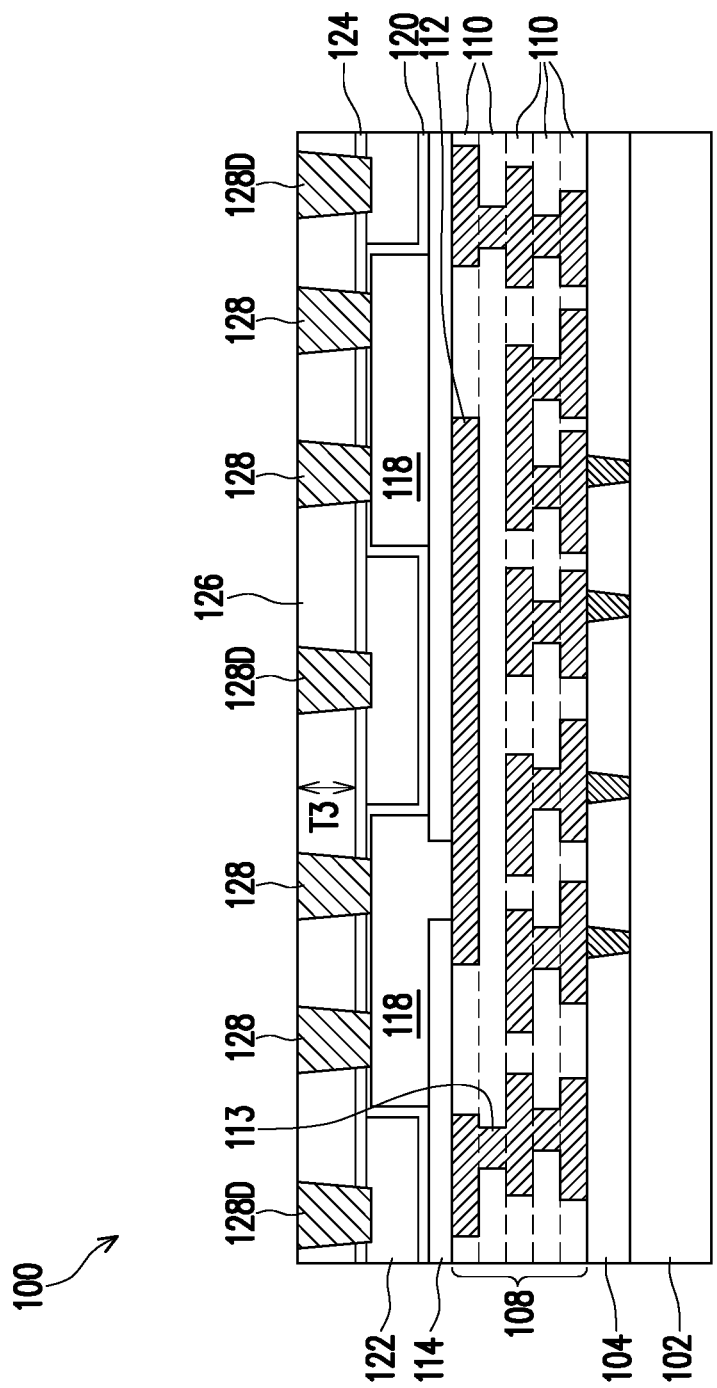

Turning to FIG. 11, bonding pads 128 are formed in the openings 127, in accordance with some embodiments. The bonding pads 128 may have similar dimensions as the openings 127 in which they are formed, and may have a similar shape (e.g., have a tapered profile). The bonding pads 128 may be formed of a conductive material including a metal or a metal alloy such as copper, silver, gold, tungsten, cobalt, aluminum, the like, or a combination thereof. In some embodiments, the bonding pads 128 and the conductive pads 118 may be different conductive materials. For example, the bonding pads 128 may be copper and the conductive pads 118 may be aluminum, though other materials are possible. In some embodiments, the formation of the bonding pads 128 includes depositing a seed layer (not shown) in the openings 127, which may include copper, a copper alloy, titanium, or the like, and then filling the remainder of the openings 127 using, for example, a plating process, an electro-less plating process, or the like. Excess conductive material and the seed layer may be removed from the surface dielectric layer 126 using a planarization process such as a CMP process. The process shown in FIG. 11 represents an example process that may be used for forming bonding pads 128, and other processes or techniques may be used in other embodiments, such as a damascene process, a dual damascene process, or another process. The bonding pads 128 formed in the openings 127A may make electrical connection to the conductive pads 118, and multiple bonding pads 128 may make electrical connection to the same conductive pad 118. In this manner, a device structure 100 may be formed, having bonding pads 128 that are electrically connected to devices in the substrate 102.

Figure 12:
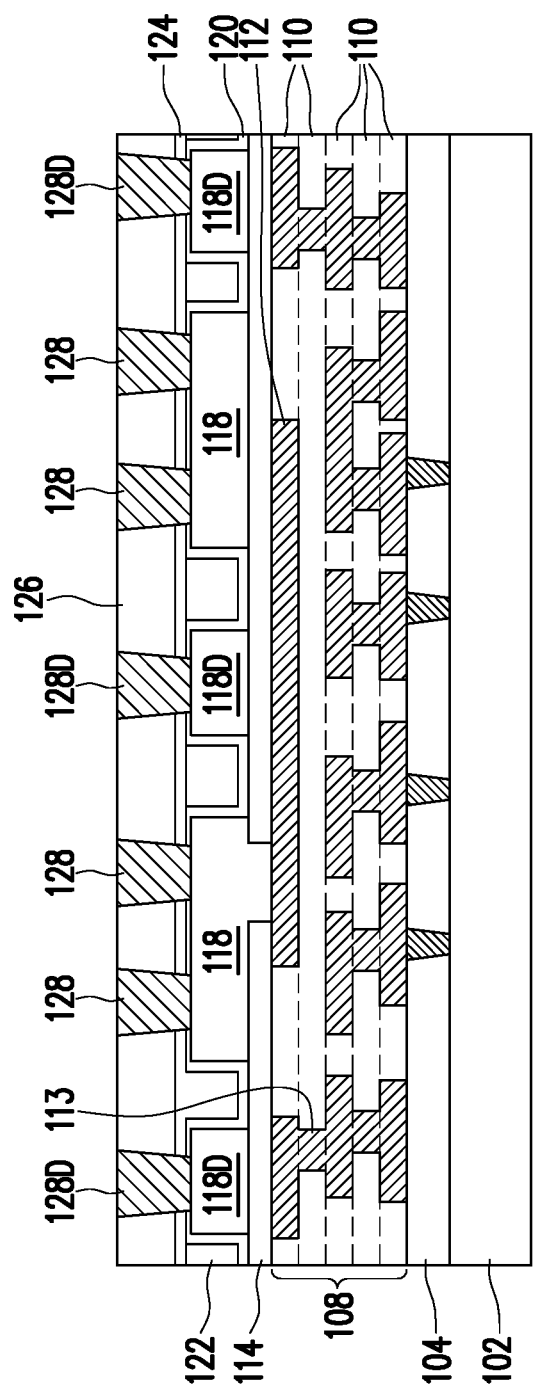
FIG. 12 illustrates a cross-sectional view of an intermediate step in a process for forming another device structure in accordance with some embodiments.

Still referring to FIG. 11, in some embodiments, some bonding pads may be formed without having electrical connection to the conductive pads 118. Bonding pads without electrical connection may be, for example, "dummy" bonding pads that may reduce uneven loading and improve surface planarity after the planarization step that removes excess conductive material. By improving surface planarity, a better bond between surfaces (see FIG. 21) may be obtained. Example dummy bonding pads are designated as bonding pads 128D in FIG. 11. Turning to FIG. 12, in some embodiments, dummy conductive pads 118 may be formed, examples of which are designated as dummy conductive pads 118D. Forming dummy conductive pads 118D may also reduce loading effects and further improve surface planarity. Dummy conductive pads 118D may be used in any of the embodiments described herein, including those described below. The dummy conductive pads 118D may or may not be electrically connected to any metal lines 112. Dummy bonding pads 128D may be formed in contact with dummy conductive pads 118D, as shown in FIG. 12. In some embodiments, dummy bonding pads 118D and/or dummy conductive pads 128D are not formed.

Returning to FIG. 11, the use of a first stop layer 120 as a stop for the planarization process (see FIG. 7) can allow for a thinner surface dielectric layer 126. For example, the surface dielectric layer 126 may be formed having a thickness T3 that is between about 0.5 µm and about 8 µm, such as about 1.5 µm or about 6 µm, though other thicknesses T3 may be used. In some cases, the embodiment processes described herein can reduce the thickness of the surface dielectric layer 126 by as much as about 50%. By reducing the thickness of the surface dielectric layer 126, the height of the bonding pads 128 may be reduced, which can reduce the resistance of the bonding pads 128 and improve electrical performance of the device. Additionally, by forming a thinner surface dielectric layer 126 as described herein, the combined thickness of all dielectric layers above the conductive pads 118 (e.g., the combined thickness of the surface dielectric layer 126, the first stop layer 120, and the second stop layer 124) may be reduced. Reducing the combined thickness of the dielectric layers in this manner can reduce the barrier to thermal conduction (e.g., across the dielectric layers), and the thermal performance of the device may be improved. A thinner surface dielectric layer 126 can also reduce undesired capacitive effects. Having a thinner surface dielectric layer 126 can also reduce the overall thickness of the final device or package.

FIGS. 13-17 illustrate intermediate stages in the formation of a device structure 150, in accordance with some embodiments. FIGS. 13-17 are cross-sectional views of a second embodiment in which the second stop layer 124 is omitted. By omitting the formation of the second stop layer 124, the number of process steps may be reduced.

Figure 13:
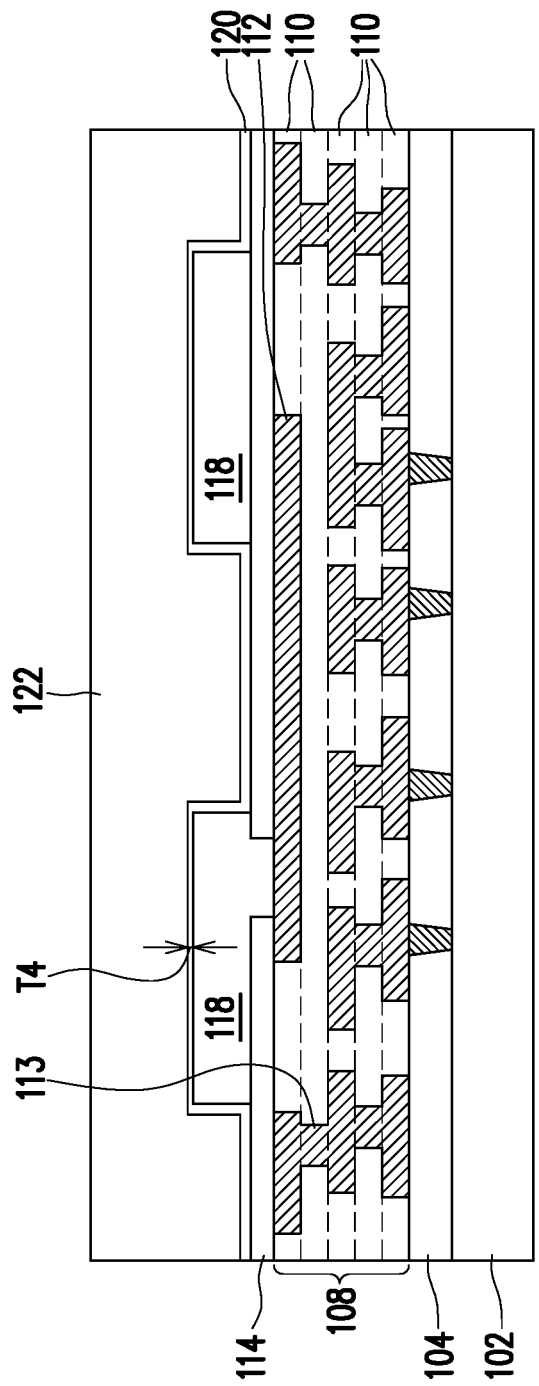
FIGS. 13-17 illustrate cross-sectional views of intermediate steps in a process for forming another device structure in accordance with some embodiments.

Turning to FIG. 13, a structure is shown that is similar to FIG. 6, in which a dielectric layer 122 has been formed over the first stop layer 120. The first stop layer 120 may be similar to that described previously in FIG. 5, and in some embodiments may be formed having a thickness T4 that is between about 500 Å and about 1500 Å, such as about 500 Å. The first stop layer 120 may be formed to a thickness suitable to stop or slow the planarization process described below in FIG. 14. The dielectric layer 122 may be a similar material as that described previously in FIG. 6, and may be formed in a similar manner.

Figure 14:
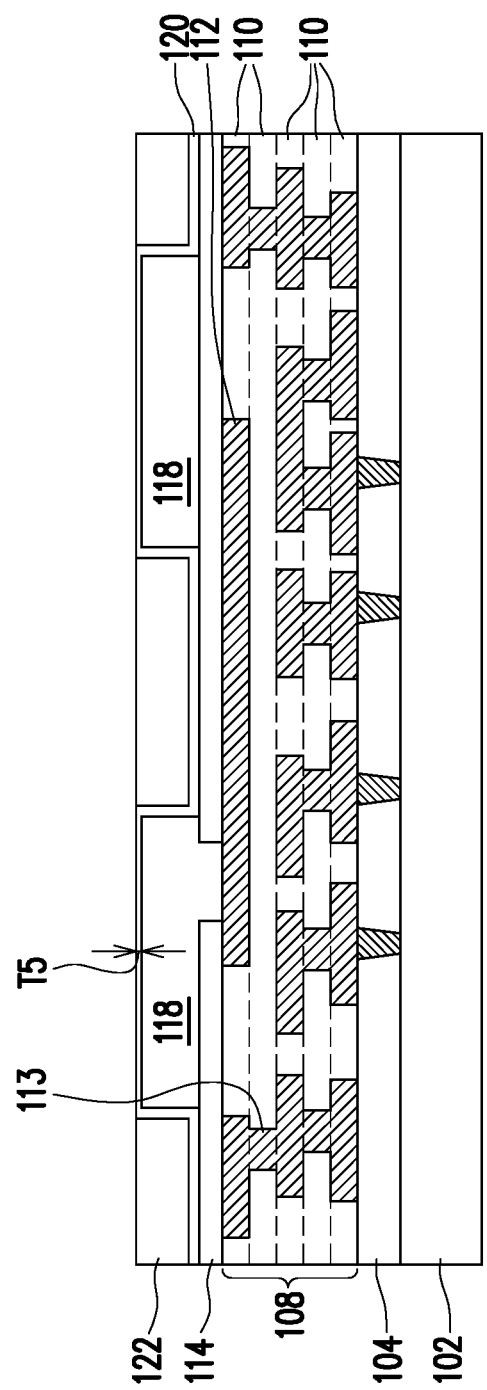

In FIG. 14, a planarization process is performed on the dielectric layer 122, using the first stop layer 120. As shown in FIG. 14, portions of the first stop layer 120 remain on the conductive pads 118. In some embodiments, the thickness T5 of the first stop layer 120 remaining on the conductive pads 118 may be between about 100 Å and about 500 Å, such as about 300 Å. In the embodiment shown in FIG. 14, the thickness T5 of the remaining first stop layer 120 may be greater than the thickness T2 of the remaining first stop layer 120 shown in FIG. 7 due to the fact that the first stop layer 120 shown in FIG. 14 is used as both a planarization stop layer and as an etch stop layer, described below in FIG. 16.

Figure 15:
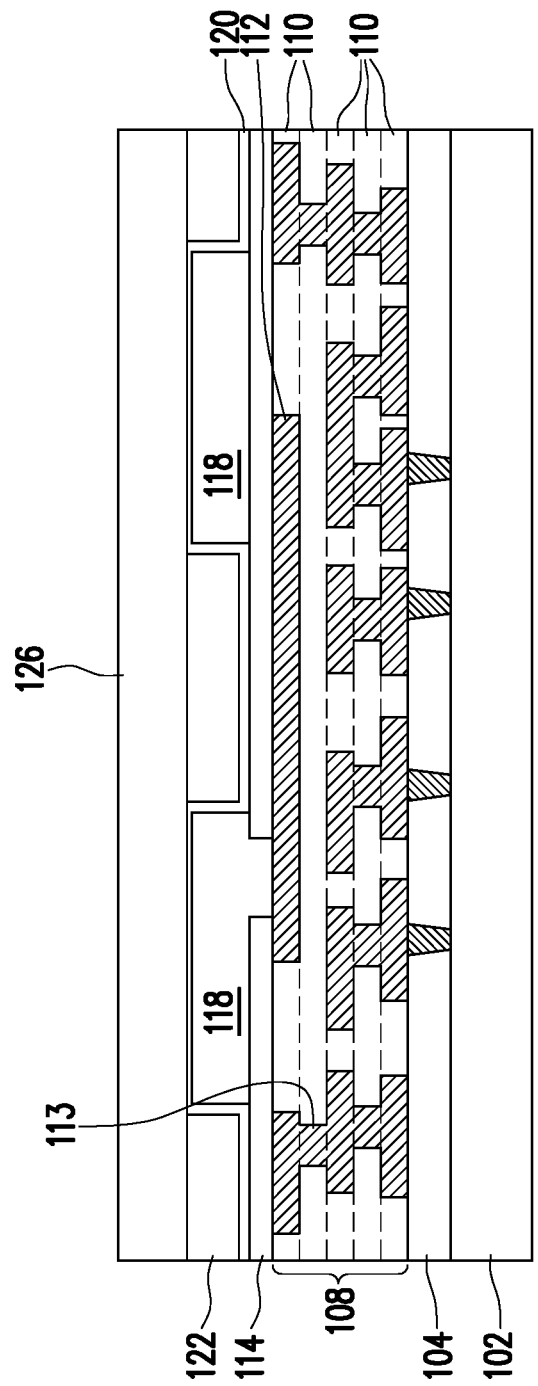
Figure 16:
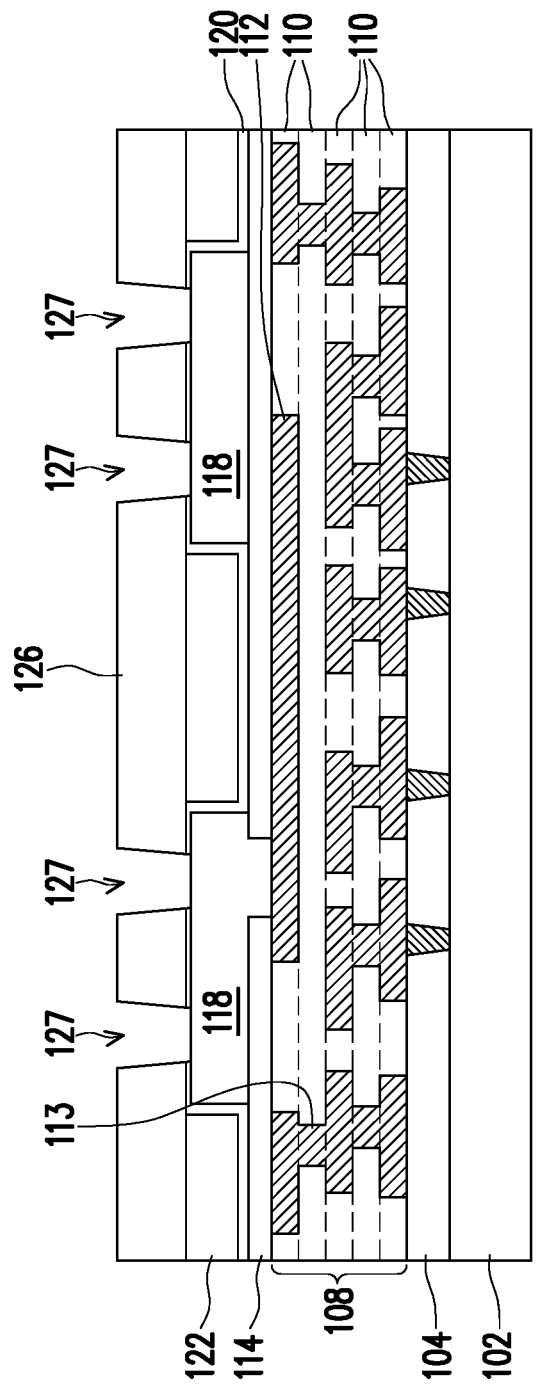

Turning to FIG. 15, a surface dielectric layer 126 is formed over the first stop layer 120, which may be similar to surface dielectric layer 126 described previously in FIG. 9. In FIG. 16, openings 127 are formed in the surface dielectric layer 126. The openings 127 may be formed using acceptable photolithography and etching techniques as described previously. The openings 127 may be formed using the first stop layer 120 as an etch stop. The openings 127 then may be extended through the first stop layer 120 to expose the conductive pads 118. In this manner, the first stop layer 120 is used both as a planarization stop layer and as an etch stop layer.

Figure 17:
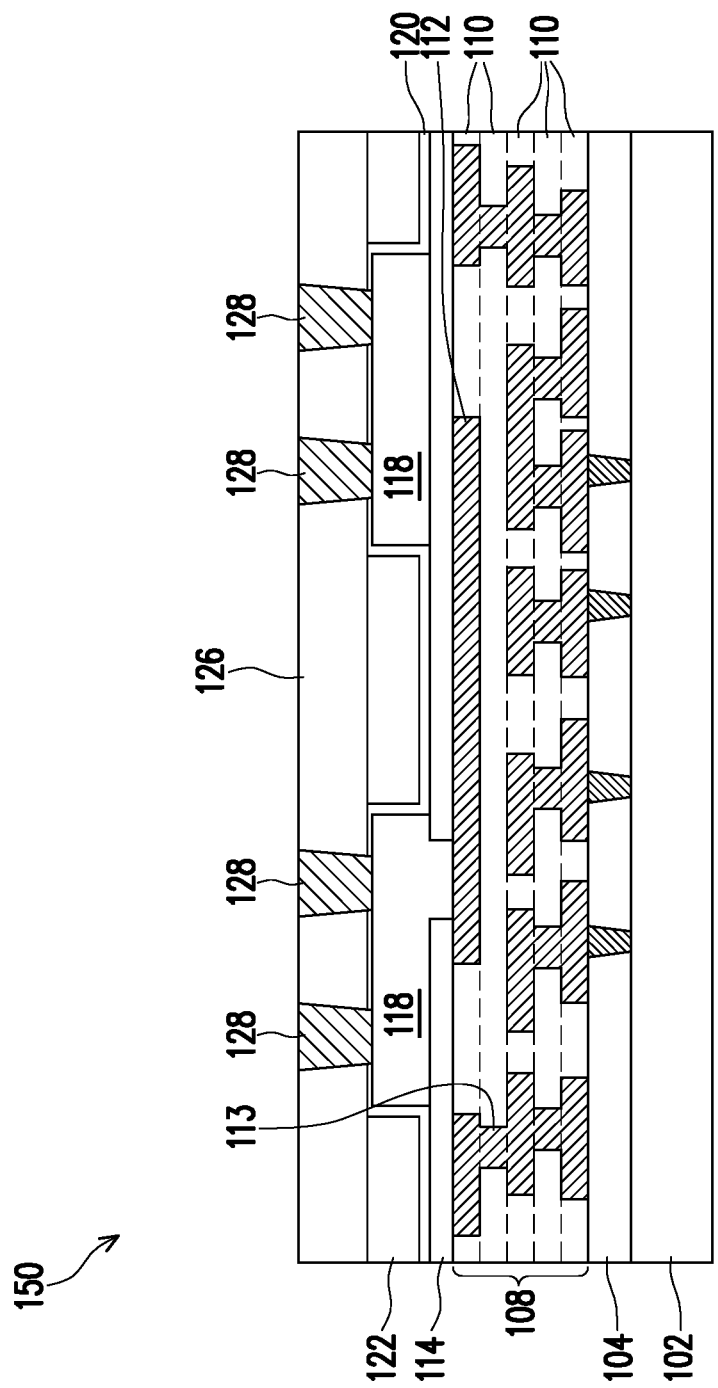

Turning to FIG. 17, bonding pads 128 are formed in the openings 127 to make electrical connection with the conductive pads 118. The bonding pads 128 may be formed in a similar manner as described previously. In this manner, a device structure 150 may be formed using a single stop layer (the first stop layer 120), and thus may be formed using fewer process steps. The device structure 150 also retains the benefit of the thinner surface dielectric layer 126 described above with respect to FIG. 11.

FIGS. 18-21 illustrate intermediate stages in the formation of a device structure 160, in accordance with some embodiments. FIGS. 18-21 are cross-sectional views of a third embodiment in which bonding pad vias may be formed through the dielectric layer 122 and the passivation layer 114 to electrically connect some bonding pads 133 to the metal layer lines of the interconnect structure 108. Besides providing additional electrical connection, the bonding pad vias can provide improved thermal conduction and thus improve the thermal performance of the device.

Figure 18:
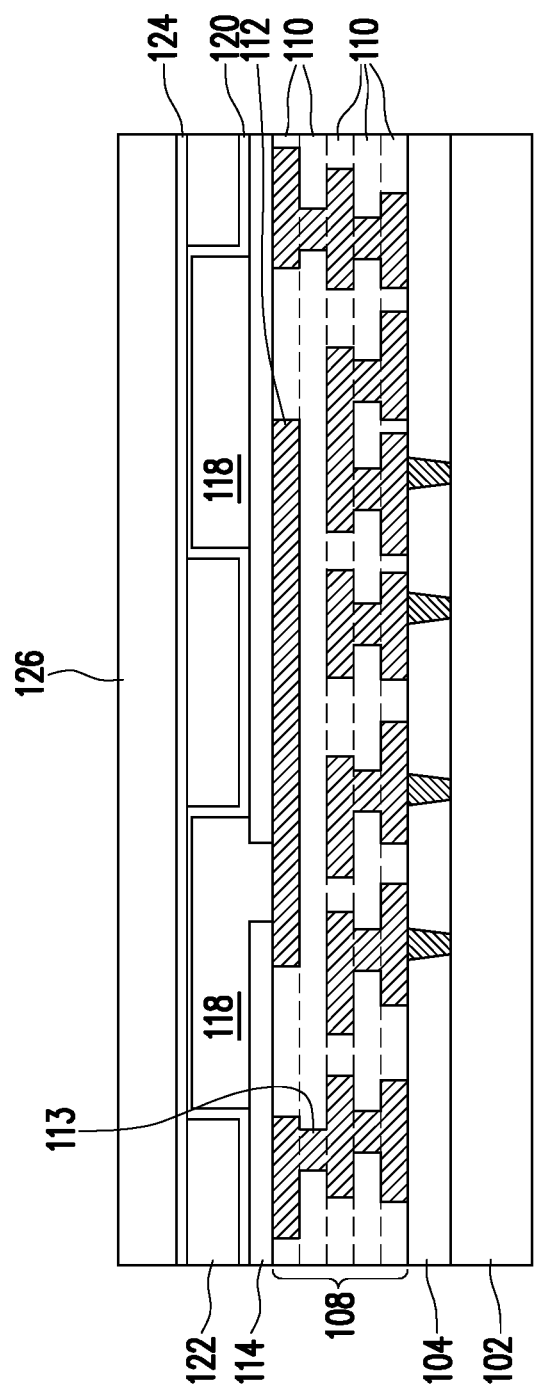
FIGS. 18-21 illustrate cross-sectional views of intermediate steps in a process for forming another device structure in accordance with some embodiments.
Figure 19:
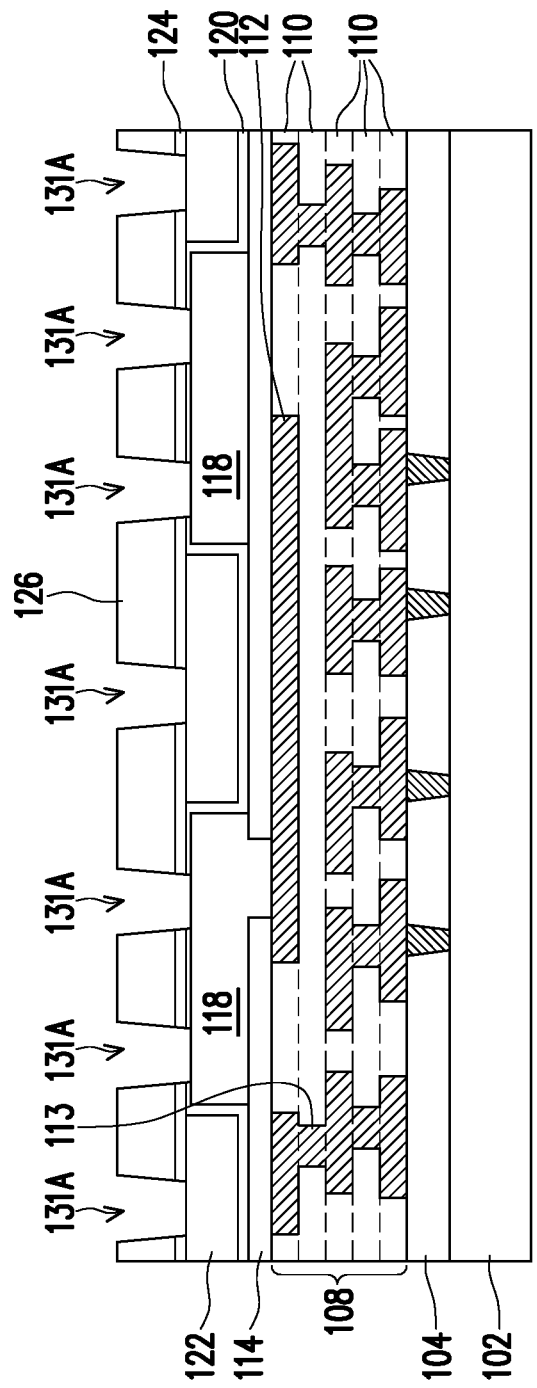

Turning to FIG. 18, a surface dielectric layer 126 is formed over the second stop layer 124, which may be similar to surface dielectric layer 126 and second stop layer 124 described previously in FIG. 9. In some embodiments, portions of the dielectric layer 122 are enclosed by the first stop layer 120 and the second stop layer 124, as shown in FIG. 18. In FIG. 19, first openings 131A are formed in the surface dielectric layer 126. The first openings 131A may be formed using acceptable photolithography and etching techniques as described previously. The first openings 131A may be formed using the second stop layer 124 and/or the first stop layer 120 as etch stops. The first openings 131A then may be extended through the second stop layer 124 and/or the first stop layer 120 to expose the conductive pads 118.

Figure 20:
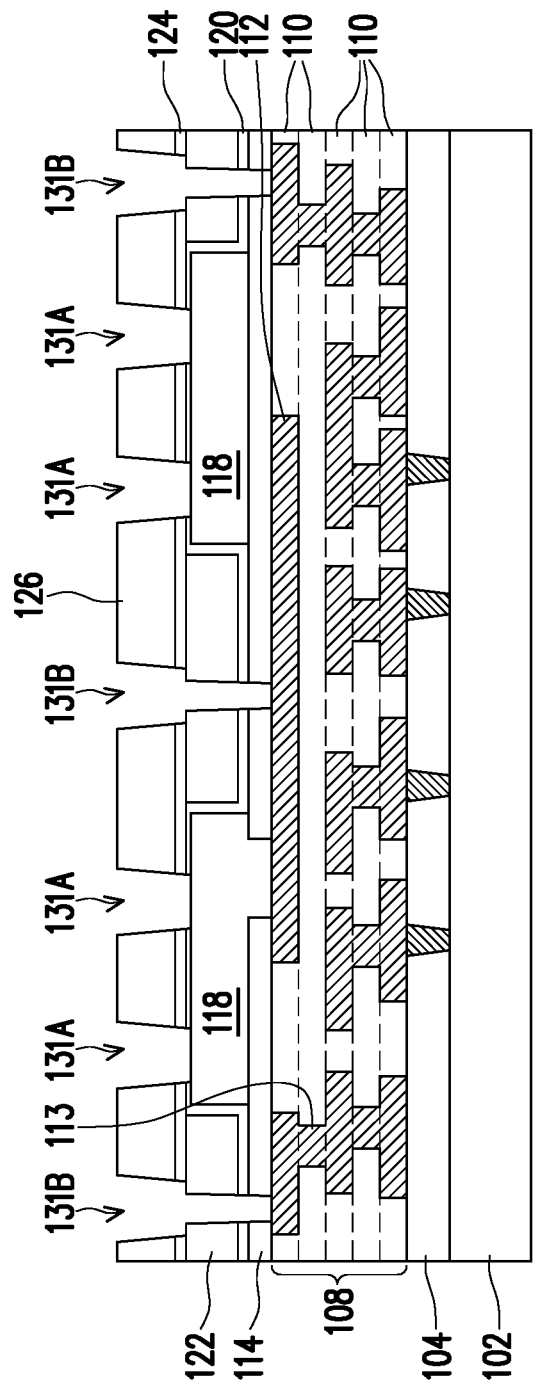

Turning to FIG. 20, via openings 131B are formed extending through the dielectric layer 122 and the passivation layer 114. The via openings 131B are formed at the bottom of the openings 131A that are not located over the conductive pads 118. The via openings 131B expose the metal layer 112 for electrical connection. The via openings 131B may be formed using acceptable photolithography and etching techniques. The photolithography process may include forming a photoresist (not shown) over the surface dielectric layer 126 and in the first openings 131A, patterning the photoresist with openings corresponding to the via openings 131B, extending the via openings 131B through the photoresist and through the passivation layer 114, and then removing the photoresist. In some embodiments, the via openings 131B may have a smaller width that is between about 1 µm and about 3 µm, or may have a width that is between about 50% and about 100% of the width of the first openings 131A.

Figure 21:
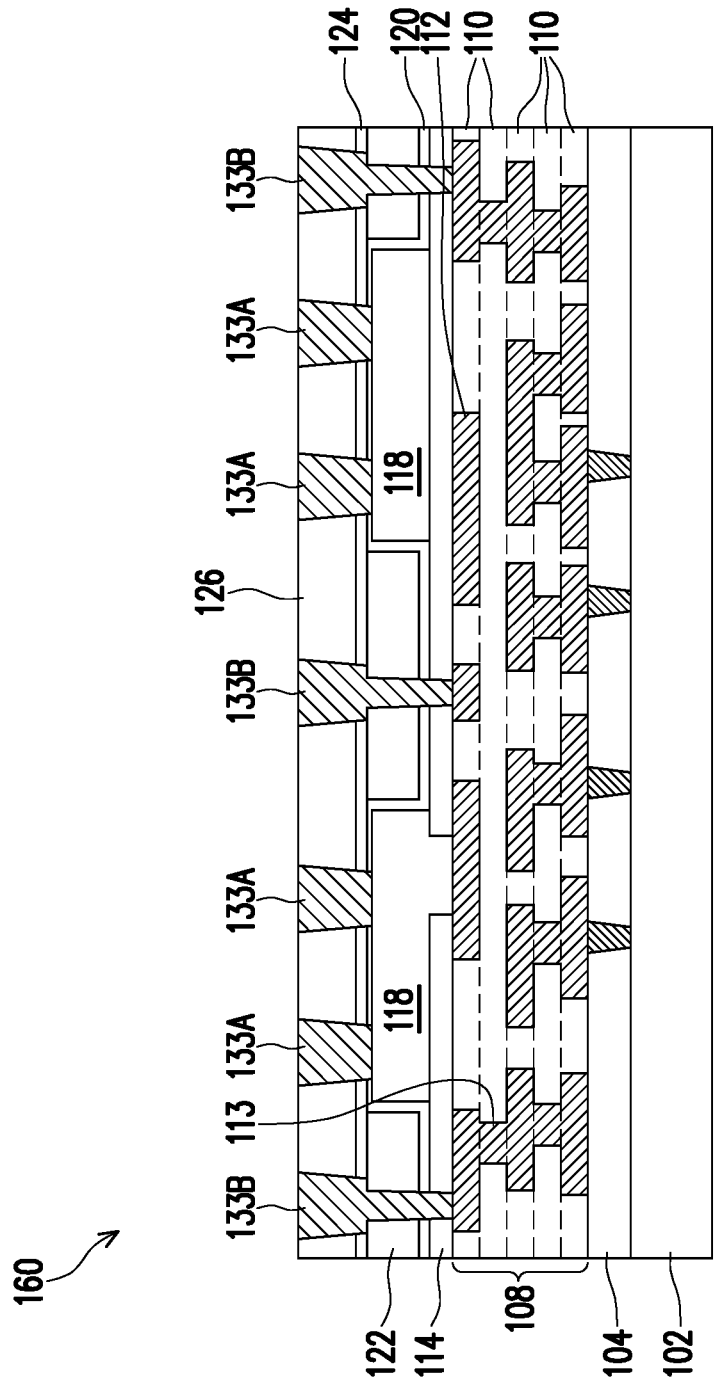

Turning to FIG. 21, bonding pads 133A and via bonding pads 133B are formed in the openings 131A and 131B to make electrical connection with the conductive pads 118 and the metal lines 112. The bonding pads 133A make electrical connection to the conductive pads 118, and the via bonding pads 133B make electrical connection to the metal lines 112. The bonding pads 133A and the via bonding pads 133B may be formed in a similar manner as bonding pads 128 described previously. In this manner, additional electrical connections may be made from bonding pads to the interconnect structure 108. In some embodiments, one or more of the via bonding pads 133B may not be electrically connected, and may be "dummy" features used to reduce loading and improve planarity. In some embodiments, a dummy via bonding pad 133B may be connected to metal layer lines 112 that are isolated from the interconnect structure 108. As shown in FIG. 21, the conductive pads 118 are separated from the surface dielectric layer 126 by the first stop layer 120 and/or the second stop layer 124.

Figure 22:
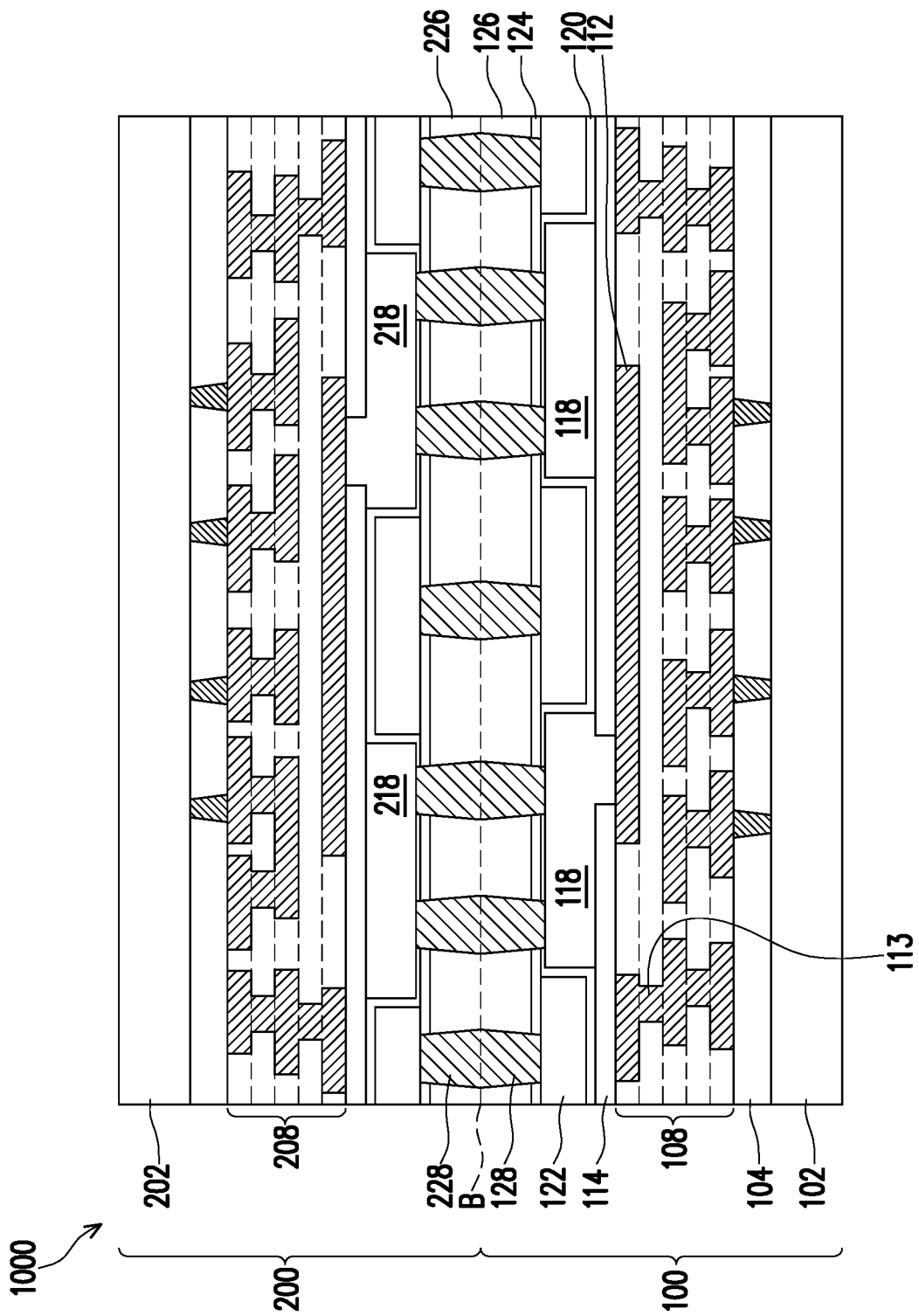
FIG. 22 illustrates a cross-sectional view of an intermediate step in a process for forming a device package in accordance with some embodiments.

Turning to FIG. 22, a device package 1000 is shown comprising two device structures bonded together, in accordance with some embodiments. The device package 1000 includes a first device structure 100 and a second device structure 200, either or both of which may be similar to device structure 100, 150, or 160 described previously. The bonding pads 128 and surface dielectric layer 126 of the first device structure 100 are bonded to the bonding pads 228 and surface dielectric layer 226 of the second device structure 200. In some embodiments, the bonding pads 128 of the first device structure 100 and the bonding pads 228 of the second device structure 200 are the same material. In some embodiments, the surface dielectric layer 126 of the first device structure 100 and the surface dielectric layer 226 of the second device structure 200 are the same material.

In FIG. 22, the second device structure 200 is bonded to the first device structure 100 using, e.g., direct bonding or hybrid bonding. Before performing the bonding, a surface treatment may be performed on the second device structure 200 or the first device structure 100. In some embodiments, the surface treatment includes a plasma treatment. The plasma treatment may be performed in a vacuum environment (e.g., a vacuum chamber, not shown). The process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). The plasma treatment may also be performed using pure or substantially pure $H_2$, Ar, or $N_2$ as the process gas, which treats the surfaces of the bonding pads 128 or 228 and the surface dielectric layers 126 or 226. The second device structure 200 or the first device structure 100 may be treated with the same surface treatment process, or with different surface treatment processes. In some embodiments, the second device structure 200 or the first device structure 100 may be cleaned after the surface treatment. Cleaning may include performing a chemical cleaning and a de-ionized water cleaning/rinse.

Next, a pre-bonding process may be performed with the second device structure 200 and the first device structure 100. The second device structure 200 and the first device structure 100 are aligned, with the bonding pads 228 of the second device structure 200 being aligned to the bonding pads 128 of the first device structure 100. After the alignment, the second device structure 200 and the first device structure 100 are pressed against each other. The pressing force may be less than about 5 Newtons per die in some embodiments, although a greater or smaller force may also be used. The pre-bonding process may be performed at room temperature (e.g., at a temperature of from about 21° C. to about 25° C.), although higher temperatures may be used. The pre-bonding time may be shorter than about 1 minute, for example.

After the pre-bonding, the surface dielectric layer 226 of the second device structure 200 and surface dielectric layer 126 of the first device structure 100 are bonded to each other. The bonding interface is labeled in FIGS. 22 and 23 as "B." The second device structure 200 and the first device structure 100 in combination are referred to as device package 1000 hereinafter. The bond of the device package 1000 may be strengthened in a subsequent annealing step. The device package 1000 may be annealed at a temperature of from about 300° C. to about 400° C., for example. The annealing may be performed for a period of time between about 1 hour and about 2 hours, for example. During the annealing, metals in the bonding pads 128 and 228 may diffuse to each other so that metal-to-metal bonds are also formed. Hence, the resulting bonds of the second device structure 200 and the first device structure 100 may be hybrid bonds. In some embodiments, after the annealing, no material interface is present between the bonding pads 118 and their corresponding bonding pads 128.

In some embodiments, a distance from the conductive pads 118 of the first device structure 100 and the conductive pads 218 of the second device structure 200 is between about 1 μm and about 16 μm, such as about 3 μm or about 12 μm. In some embodiments, the distance from the conductive pads 118 to the interface B is different than the distance from the conductive pads 218 to the interface B. In some embodiments, one or more bonding pads 128 may be offset along the interface B from their corresponding bonding pads 228. In some embodiments, a bonding pad 128 and its corresponding bonding pad 228 may be electrically isolated from conductive pads 118, conductive pads 218, interconnect structure 108, and/or interconnect structure 208. Bonding pads 128 or bonding pads 228 that are completely isolated electrically may be considered "dummy" conductive features in some cases. In some embodiments, one or more of the bonding pads 128 may be electrically connected to the interconnect structure 108 (e.g., similar to via bonding pads 133B shown in FIG. 21), and one or more of the bonding pads 228 may be electrically connected to the interconnect structure 208. In some embodiments, a bonding pad 128 connected to a conductive pad 118 may be bonded to a bonding pad 228 that is not connected to a conductive pad 218. In some embodiments, the bonding pads 128 or the bonding pads 228 may have a tapered profile, with the largest width near the interface B. In some embodiments, the bonding pads 128 may have a different width or profile than the bonding pads 228.

Figure 23:
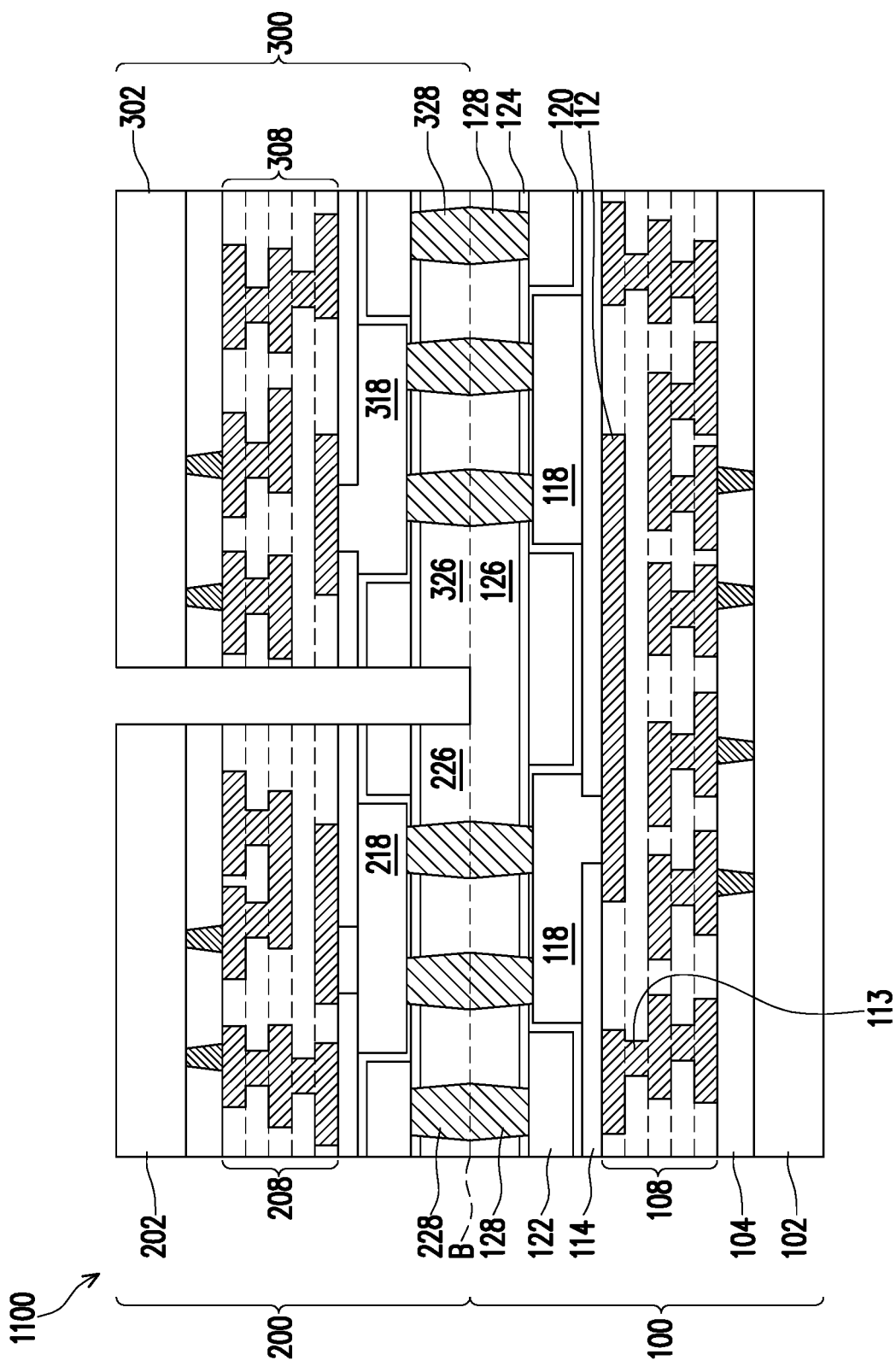
FIG. 23 illustrates a cross-sectional view of an intermediate step in a process for forming another device package in accordance with some embodiments.

Turning to FIG. 23, a device package 1100 is shown. The device package 1100 is similar to device package 1000, except that a third device structure 300 is bonded to the first device structure 100 in addition to the second device structure 200. The third device structure 300 and the first device structure 100 may be bonded in a similar manner as described for FIG. 22. All such variations of forming device packages are contemplated within the scope of this disclosure. In some embodiments, a singulation process may be performed on the device package 1000 or device package 1100 after bonding.

Figure 24:
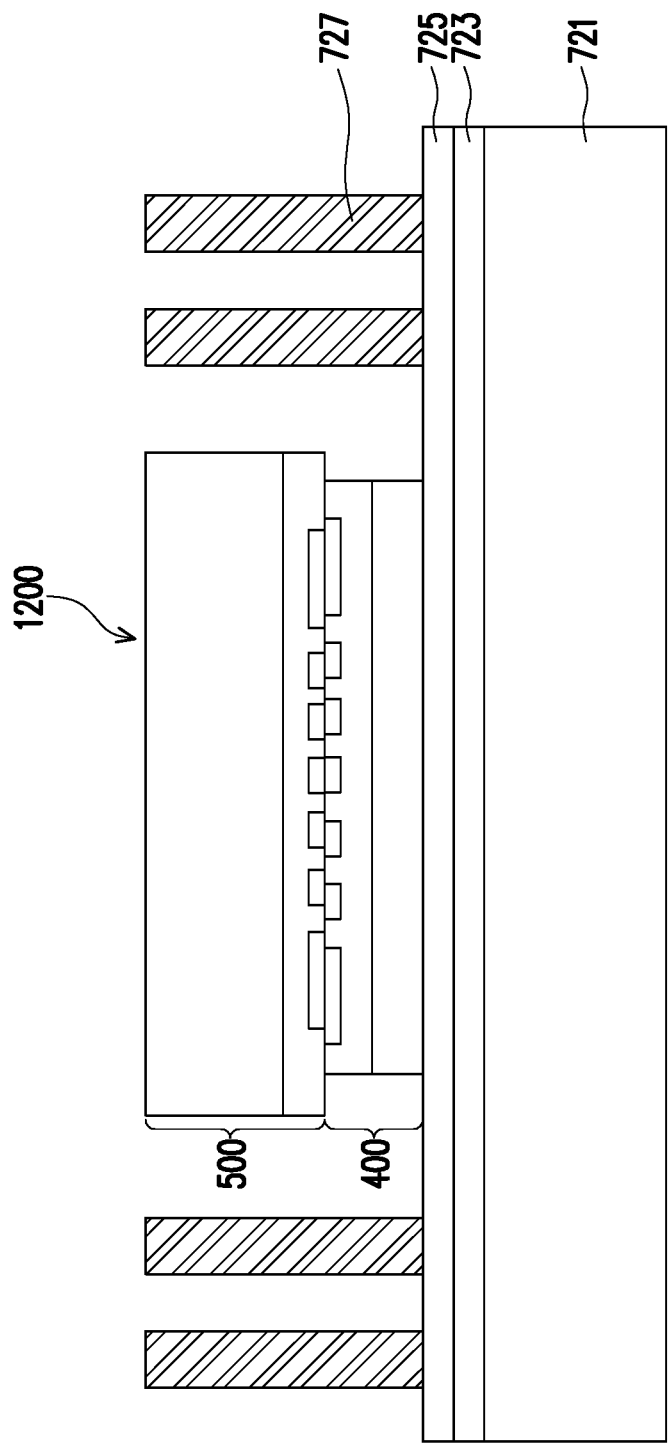
FIGS. 24-28 illustrate cross-sectional views of intermediate steps in a process for forming a package in accordance with some embodiments.

FIGS. 24 through 28 illustrate intermediate steps in the formation of a package 1300 including a device package 1200, in accordance with some embodiments. FIG. 24 illustrates a fourth device structure 400 and a fifth device structure 500 that have been bonded into a device package 1200. The fourth device structure 400 and the fifth device structure 500 may be similar to device structures 100, 150, 160, 200, or 300 described previously, and the device package 1200 may be similar to device packages 1000 or 1100 described previously.

FIG. 24 also illustrates a carrier substrate 721 with an adhesive layer 723 and a polymer layer 725 over the adhesive layer 723. In some embodiments, the carrier substrate 721 includes, for example, silicon based materials, such as glass or silicon oxide, or other materials, such as aluminum oxide, combinations of any of these materials, or the like. The carrier substrate 721 may be planar in order to accommodate an attachment of semiconductor devices such as the device package 1200. The adhesive layer 723 is placed on the carrier substrate 721 in order to assist in the adherence of overlying structures (e.g., the polymer layer 725). In some embodiments, the adhesive layer 723 may include a light to heat conversion (LTHC) material or an ultra-violet glue which loses its adhesive properties when exposed to ultra-violet light. However, other types of adhesives, such as pressure sensitive adhesives, radiation curable adhesives, epoxies, combinations of these, or the like, may also be used. The adhesive layer 723 may be placed onto the carrier substrate 721 in a semi-liquid or gel form, which is readily deformable under pressure.

The polymer layer 725 is placed over the adhesive layer 723 and is utilized in order to provide protection to, e.g., the device package 1200. In some embodiments, the polymer layer 725 may be polybenzoxazole (PBO), although any suitable material, such as polyimide or a polyimide derivative, may alternatively be utilized. The polymer layer 725 may be placed using, e.g., a spin-coating process to a thickness of between about 2 µm and about 15 µm, such as about 5 µm, although any suitable method and thickness may alternatively be used. The device package 1200 is attached onto the polymer layer 725. In some embodiments, the device package 1200 may be placed using, e.g. a pick-and-place process. However, any suitable method of placing the device package 1200 may be utilized.

In some embodiments, through-vias such as through-dielectric vias (TDVs) 727 are formed over the polymer layer 725. In some embodiments, a seed layer (not shown) is first formed over the polymer layer 725. The seed layer is a thin layer of a conductive material that aids in the formation of a thicker layer during subsequent processing steps. In some embodiments, the seed layer may include a layer of titanium about 500 Å thick followed by a layer of copper about 3,000 Å thick. The seed layer may be created using processes such as sputtering, evaporation, or PECVD processes, depending upon the desired materials. Once the seed layer is formed, a photoresist (not shown) may be formed and patterned over the seed layer. The TDVs 727 are then formed within the patterned photoresist. In some embodiments, the TDVs 727 include one or more conductive materials, such as copper, tungsten, other conductive metals, or the like, and may be formed, for example, by electroplating, electroless plating, or the like. In some embodiments, an electroplating process is used wherein the seed layer and the photoresist are submerged or immersed in an electroplating solution. Once the TDVs 727 have been formed using the photoresist and the seed layer, the photoresist may be removed using a suitable removal process. In some embodiments, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer. Once the TDVs 727 have been formed, exposed portions of the seed layer are then removed, for example, using a wet or dry etching process. The TDVs 727 may be formed to a height of between about 180 µm and about 200 µm, with a critical dimension of about 190 µm and a pitch of about 300 µm.

Figure 25:
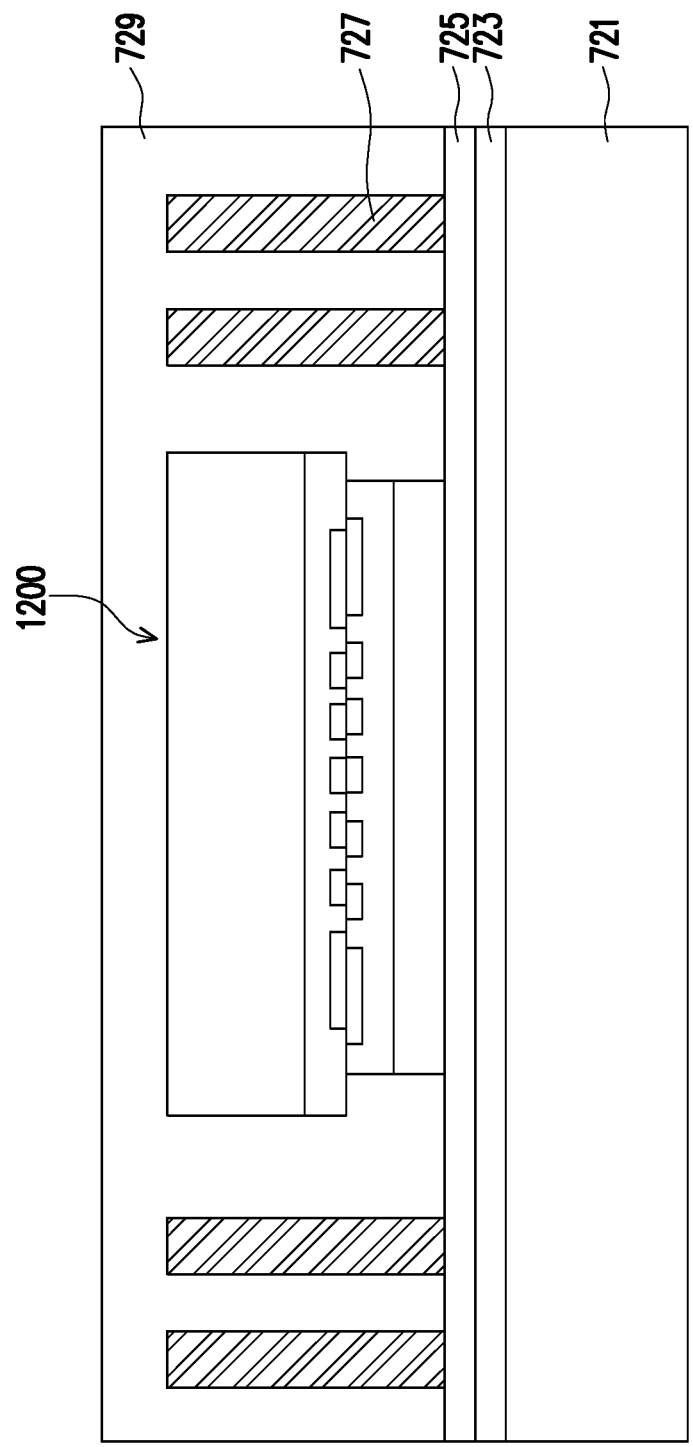
Figure 26:
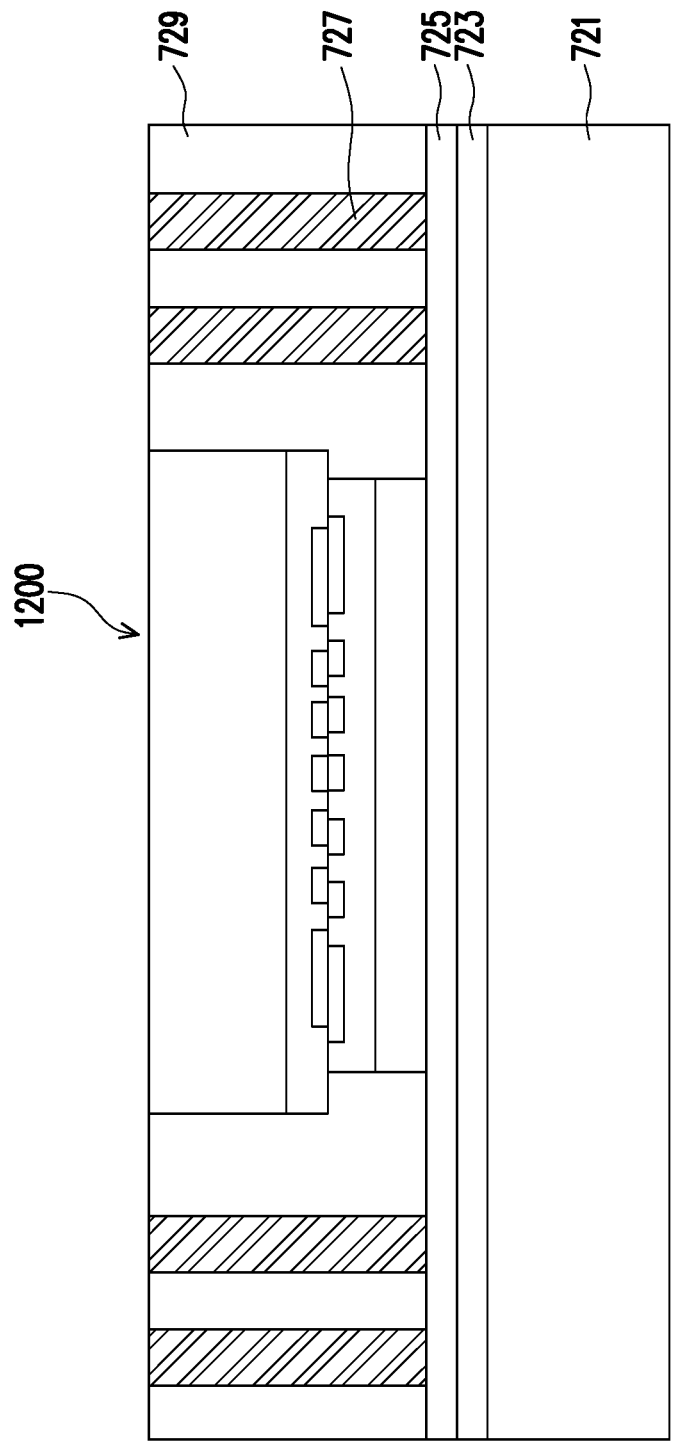

FIG. 25 illustrates an encapsulation of the device package 1200 and the TDVs 727 with an encapsulant 729. The encapsulant 729 may be a molding compound such as a resin, polyimide, PPS, PEEK, PES, a heat resistant crystal resin, combinations of these, or the like. FIG. 26 illustrates a thinning of the encapsulant 729 in order to expose the TDVs 727 and the device package 1200. The thinning may be performed, e.g., using a CMP process or another process.

Figure 27:
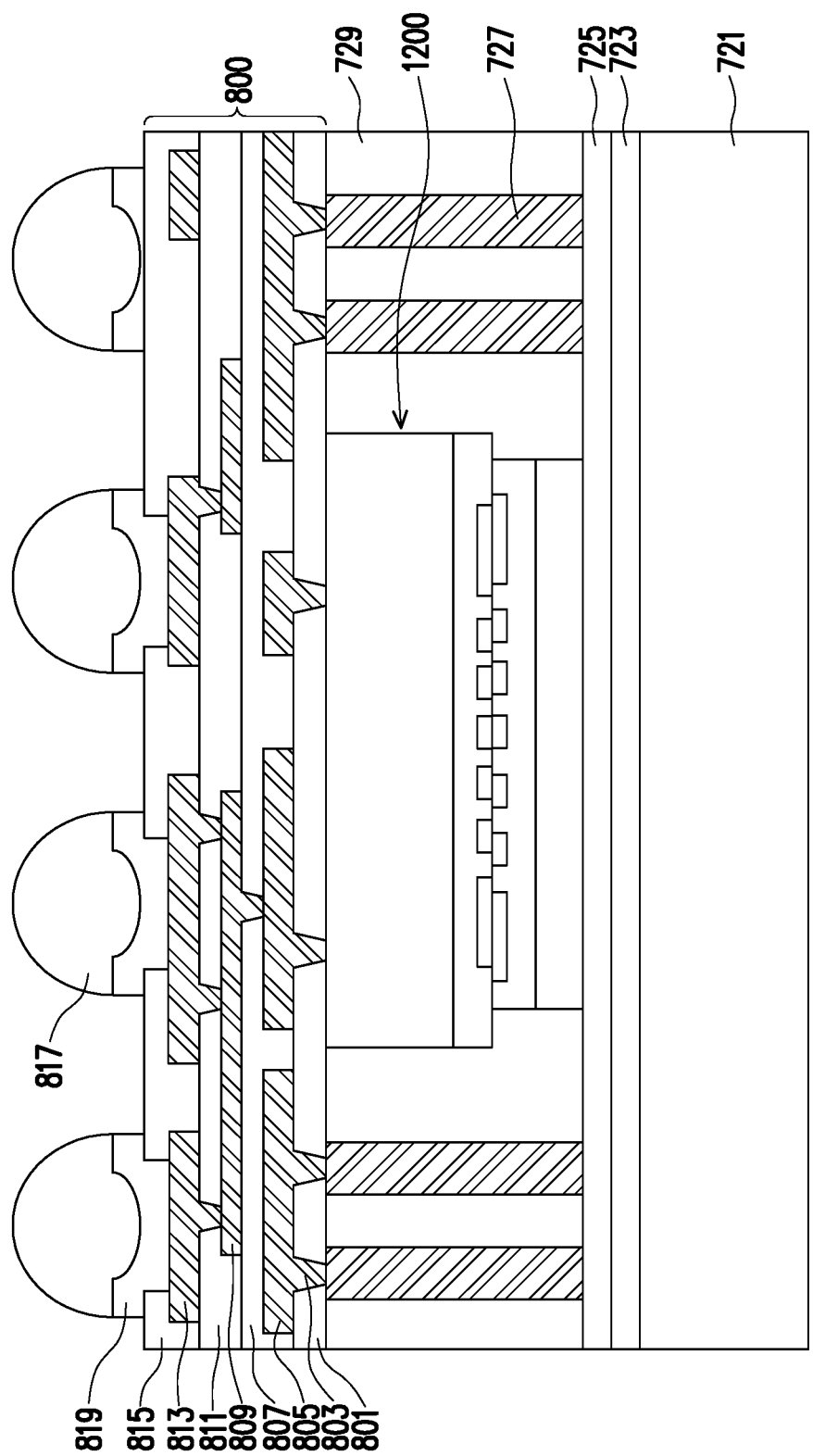

FIG. 27 illustrates a formation of a redistribution structure 800 with one or more layers over the encapsulant 729. In some embodiments, the redistribution structure 800 may be formed by initially forming a first redistribution passivation layer 801 over the encapsulant 729. In some embodiments, the first redistribution passivation layer 801 may be polybenzoxazole (PBO), although any suitable material, such as polyimide or a polyimide derivative, such as a low temperature cured polyimide, may alternatively be utilized. The first redistribution passivation layer 801 may be placed using, e.g., a spin-coating process to a thickness of between about 5 µm and about 17 µm, such as about 7 µm, although any suitable method and thickness may alternatively be used.

Once the first redistribution passivation layer 801 has been formed, first redistribution vias 803 may be formed through the first redistribution passivation layer 801 in order to make electrical connections to the device package 1200 and the TDVs 727. In some embodiments the first redistribution vias 803 may be formed by using a damascene process, a dual damascene process, or another process. After the first redistribution vias 803 have been formed, a first redistribution layer 805 is formed over and in electrical connection with the first redistribution vias 803. In some embodiments the first redistribution layer 805 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 805 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 4 µm. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 805.

After the first redistribution layer 805 has been formed, a second redistribution passivation layer 807 may be formed and patterned to help isolate the first redistribution layer 805. In some embodiments the second redistribution passivation layer 807 may be similar to the first redistribution passivation layer 801, such as by being a positive tone PBO, or may be different from the first redistribution passivation layer 801, such as by being a negative tone material such as a low-temperature cured polyimide. The second redistribution passivation layer 807 may be placed to a thickness of about 7 µm. Once in place, the second redistribution passivation layer 807 may be patterned to form openings using, e.g., a photolithographic masking and etching process or, if the material of the second redistribution passivation layer 807 is photosensitive, exposing and developing the material of the second redistribution passivation layer 807. However, any suitable material and method of patterning maybe utilized.

After the second redistribution passivation layer 807 has been patterned, a second redistribution layer 809 may be formed to extend through the openings formed within the second redistribution passivation layer 807 and make electrical connection with the first redistribution layer 805. In some embodiments the second redistribution layer 809 may be formed using materials and processes similar to the first redistribution layer 805. For example, a seed layer may be applied and covered by a patterned photoresist, a conductive material such as copper may be applied onto the seed layer, the patterned photoresist may be removed, and the seed layer may be etched using the conductive material as a mask. In some embodiments the second redistribution layer 809 is formed to a thickness of about 4 μm. However, any suitable material or process of manufacture may be used.

After the second redistribution layer 809 has been formed, a third redistribution passivation layer 811 is applied over the second redistribution layer 809 in order to help isolate and protect the second redistribution layer 809. In some embodiments the third redistribution passivation layer 811 may be formed of similar materials and in a similar fashion as the second redistribution passivation layer 807 to a thickness of about 7 μm. For example, the third redistribution passivation layer 811 may be formed of PBO or a low-temperature cured polyimide that has been applied and patterned as described above with respect to the second redistribution passivation layer 807. However, any suitable material or process of manufacture may be utilized.

After the third redistribution passivation layer 811 has been patterned, a third redistribution layer 813 may be formed to extend through the openings formed within the third redistribution passivation layer 811 and make electrical connection with the second redistribution layer 809. In some embodiments the third redistribution layer 813 may be formed using materials and processes similar to the first redistribution layer 805. For example, a seed layer may be applied and covered by a patterned photoresist, a conductive material such as copper may be applied onto the seed layer, the patterned photoresist may be removed, and the seed layer may be etched using the conductive material as a mask. In some embodiments the third redistribution layer 813 is formed to a thickness of 5 μm. However, any suitable material or process of manufacture may be used.

After the third redistribution layer 813 has been formed, a fourth redistribution passivation layer 815 may be formed over the third redistribution layer 813 in order to help isolate and protect the third redistribution layer 813. In some embodiments the fourth redistribution passivation layer 815 may be formed of similar materials and in a similar fashion as the second redistribution passivation layer 807. For example, the fourth redistribution passivation layer 815 may be formed of PBO or a low-temperature cured polyimide that has been applied and patterned as described above with respect to the second redistribution passivation layer 807. In some embodiments the fourth redistribution passivation layer 815 is formed to a thickness of about 8 μm. However, any suitable material or process of manufacture may be utilized.

In other embodiments, the redistribution vias and redistribution layers of the redistribution structure 800 may be formed using a damascene process, such as a dual-damascene process. For example, a first redistribution passivation layer may be formed over the encapsulant 729. The first redistribution passivation layer is then patterned using one or more photolithographic steps to form both openings for vias and openings for conductive lines within the first redistribution passivation layer. A conductive material may be formed in the openings for vias and the openings for conductive lines to form the first redistribution vias and the first redistribution layer. Additional redistribution passivation layers may be formed over the first redistribution passivation layer, and additional sets of redistribution vias and conductive lines may be formed in the additional redistribution passivation layers as described for the first redistribution passivation layer, forming the redistribution structure 800. This or other techniques may be used to form the redistribution structure 800.

FIG. 27 additionally illustrates a formation of underbump metallizations 819 and third external connectors 817 to make electrical contact with the third redistribution layer 813. In some embodiments the underbump metallizations 819 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations 819. Any suitable materials or layers of material that may be used for the underbump metallizations 819 are fully intended to be included within the scope of the embodiments.

In some embodiments, the underbump metallizations 819 are created by forming each layer over the third redistribution layer 813 and along the interior of the openings through the fourth redistribution passivation layer 815. The forming of each layer may be performed using a plating process, such as electrochemical plating, although other processes of formation, such as sputtering, evaporation, or PECVD process, may be used depending upon the desired materials. The underbump metallizations 819 may be formed to have a thickness of between about 0.7 μm and about 10 μm, such as about 5 μm.

In some embodiments the third external connectors 817 may be placed on the underbump metallizations 819 and may be a ball grid array (BGA) which comprises a eutectic material such as solder, although any suitable materials may alternatively be used. In some embodiments in which the third external connectors 817 are solder balls, the third external connectors 817 may be formed using a ball drop method, such as a direct ball drop process. In another embodiment, the solder balls may be formed by initially forming a layer of tin through any suitable method such as evaporation, electroplating, printing, solder transfer, and then performing a reflow in order to shape the material into the desired bump shape. Once the third external connectors 817 have been formed, a test may be performed to ensure that the structure is suitable for further processing.

Figure 28:
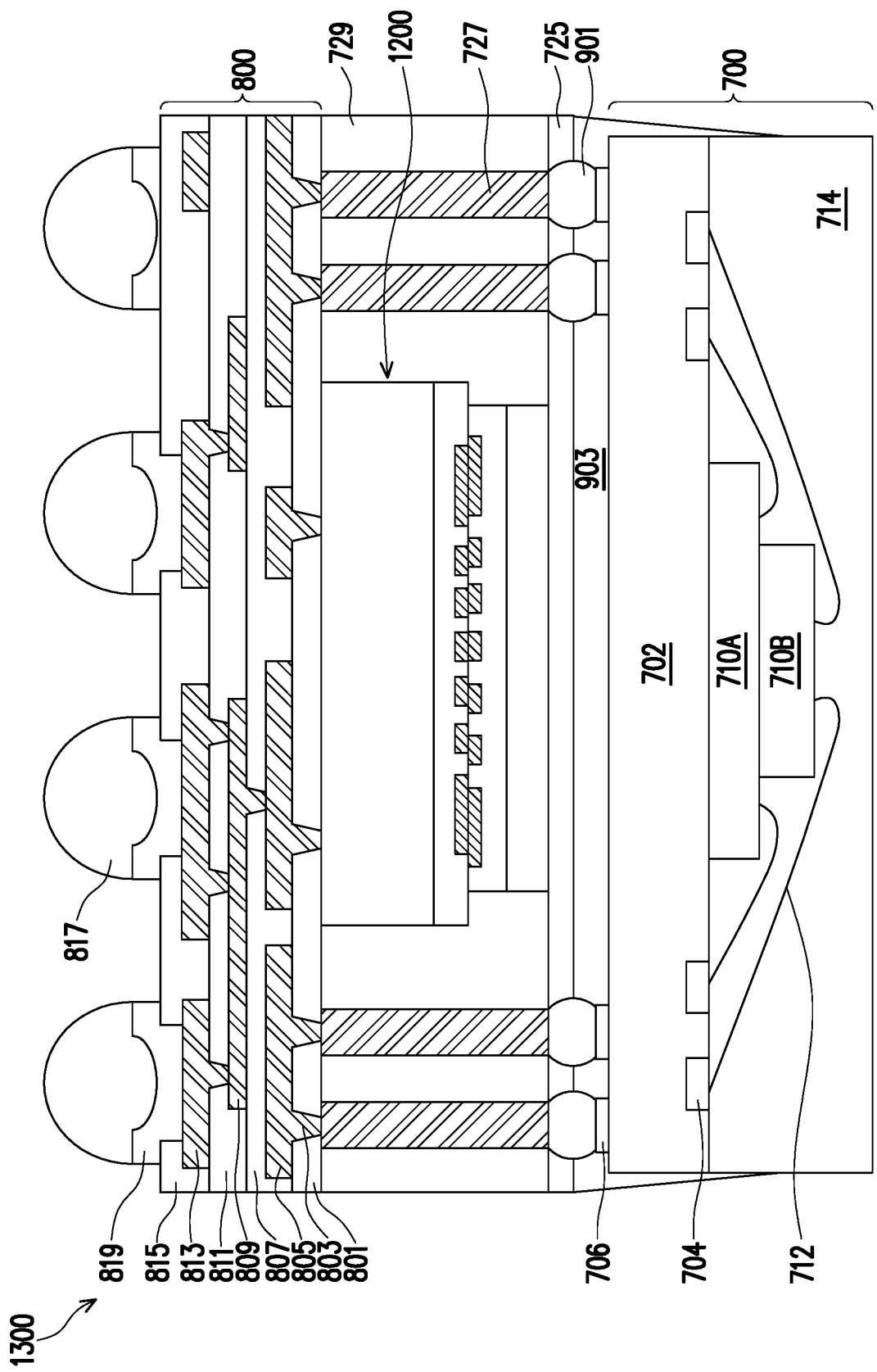

FIG. 28 illustrates a bonding of a package 700 to the TDVs 727 through the polymer layer 725. Prior to bonding the package 700, the carrier substrate 721 and the adhesive layer 723 are removed from the polymer layer 725. The polymer layer 725 is also patterned to expose the TDVs 727. In some embodiments, the polymer layer 725 may be patterned using, e.g., a laser drilling method. In such a method a protective layer, such as a light-to-heat conversion (LTHC) layer or a hogomax layer (not separately illustrated) is first deposited over the polymer layer 725. Once protected, a laser is directed towards those portions of the polymer layer 725 which are desired to be removed in order to expose the underlying TDVs 727. During the laser drilling process the drill energy may be in a range from 0.1 mJ to about 30 mJ, and a drill angle of about 0 degree (perpendicular to the polymer layer 725) to about 85 degrees to normal of the polymer layer 725. In some embodiments the patterning may be formed to form openings over the TDVs 727 to have a width of between about 100 μm and about 300 μm, such as about 200 μm.

In another embodiment, the polymer layer 725 may be patterned by initially applying a photoresist (not individually illustrated) to the polymer layer 725 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 725 are removed with, e.g., a dry etch process. However, any other suitable method for patterning the polymer layer 725 may be utilized.

In some embodiments, the package 700 includes a substrate 702 and one or more stacked dies 710 (710A and 710B) coupled to the substrate 702. Although one set of stacked dies 710 (710A and 710B) is illustrated, in other embodiments, a plurality of stacked dies 710 (each having one or more stacked dies) may be disposed side-by-side and be coupled to a same surface of the substrate 702. The substrate 702 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 702 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 702 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 702.

The substrate 702 may include active and passive devices (not shown). A wide variety of devices such as transistors, capacitors, resistors, combinations of these, and the like may be used to generate the structural and functional requirements of the design for the package 700. The devices may be formed using any suitable methods.

The substrate 702 may also include metallization layers or conductive vias (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 702 is substantially free of active and passive devices.

The substrate 702 may have bond pads 704 on a first side of the substrate 702 to couple to the stacked dies 710, and bond pads 706 on a second side of the substrate 702, the second side being opposite the first side of the substrate 702, to couple to the external connections 901. In some embodiments, the bond pads 704 and 706 are formed by forming recesses (not shown) into dielectric layers (not shown) on the first and second sides of the substrate 702. The recesses may be formed to allow the bond pads 704 and 706 to be embedded into the dielectric layers. In other embodiments, the recesses are omitted as the bond pads 704 and 706 may be formed on the dielectric layer. In some embodiments, the bond pads 704 and 706 include a thin seed layer (not shown) made of copper, titanium, nickel, gold, palladium, the like, or a combination thereof. The conductive material of the bond pads 704 and 706 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 704 and 706 is copper, tungsten, aluminum, silver, gold, the like, or a combination thereof.

In an embodiment, the bond pads 704 and bond pads 706 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 704 and 706. Any suitable materials or layers of material that may be used for the bond pads 704 and 706 are fully intended to be included within the scope of the current application. In some embodiments, the conductive vias extend through the substrate 702 and couple at least one of the bond pads 704 to at least one of the bond pads 706.

In the illustrated embodiment, the stacked dies 710 are coupled to the substrate 702 by wire bonds 712, although other connections may be used, such as conductive bumps. In an embodiment, the stacked dies 710 are stacked memory dies. For example, the stacked dies 710 may be memory dies such as low-power (LP) double data rate (DDR) memory modules, such as LPDDR1, LPDDR2, LPDDR3, LPDDR4, or the like memory modules.

The stacked dies 710 and the wire bonds 712 may be encapsulated by a molding material 714. The molding material 714 may be molded on the stacked dies 710 and the wire bonds 712, for example, using compression molding. In some embodiments, the molding material 714 is a molding compound, a polymer, an epoxy, silicon oxide filler material, the like, or a combination thereof. A curing process may be performed to cure the molding material 714. The curing process may be a thermal curing, a UV curing, the like, or a combination thereof.

In some embodiments, the stacked dies 710 and the wire bonds 712 are buried in the molding material 714, and after the curing of the molding material 714, a planarization step, such as a grinding, is performed to remove excess portions of the molding material 714 and provide a substantially planar surface for the package 700.

In some embodiments, external connections 901 may be formed to provide an external connection between the package 700 and, e.g., the TDVs 727. The external connections 901 may be contact bumps such as microbumps or controlled collapse chip connection (C4) bumps and may comprise a material such as tin, or other suitable materials, such as silver or copper. In some embodiments in which the external connections 901 are tin solder bumps, the external connections 901 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

Once the external connections 901 have been formed, the external connections 901 are aligned with and placed over the TDVs 727, and a bonding is performed. For example, in some embodiments in which the external connections 901 are solder bumps, the bonding process may comprise a reflow process whereby the temperature of the external connections 901 is raised to a point where the external connections 901 will liquefy and flow, thereby bonding the package 700 to the TDVs 727 once the external connections 901 resolidify. An encapsulant 903 may be formed to encapsulate and protect the package 700. The encapsulant 903 may extend between the polymer layer 725 and the package 700 and may be an underfill in some embodiments. In this manner, a package 1300 may be formed.

Embodiments may achieve advantages. By using a planarization stop layer over the conductive pads, the planarization process may be stopped near the top surface of the conductive pads. This can enable the formation of a thinner surface dielectric layer (e.g., "bonding oxide"). By reducing the thickness of the surface dielectric layer, the overall thickness of a package containing the device may be reduced. Additionally, the thinner surface dielectric layer provides improved thermal conduction and thus can improve the thermal performance of the device.

In an embodiment, a device includes an interconnect structure over a substrate, multiple first conductive pads over and connected to the interconnect structure, a planarization stop layer extending over the sidewalls and top surfaces of the first conductive pads of the multiple first conductive pads, a surface dielectric layer extending over the planarization stop layer, and multiple first bonding pads within the surface dielectric layer and connected to the multiple first conductive pads. In an embodiment, the device includes an etch stop layer extending over the planarization stop layer, the surface dielectric layer on the etch stop layer. In an embodiment, the device includes a first dielectric layer between the planarization stop layer and the etch stop layer. In an embodiment, the multiple bonding pads extend through the planarization stop layer and the etch stop layer. In an embodiment, the planarization stop layer includes silicon carbide. In an embodiment, the surface dielectric layer has a thickness between 6 μm and 8 μm. In an embodiments, the device includes a second dielectric layer between the interconnect structure and the multiple first conductive pads, wherein the planarization stop layer extends over a top surface of the second dielectric layer. In an embodiment, the device includes multiple second conductive pads over the interconnect structure and includes multiple second bonding pads within the surface dielectric layer and connected to the multiple second conductive pads, wherein the second conductive pads are isolated from the interconnect structure. In an embodiment, the multiple first conductive pads include aluminum.

In an embodiment, a method includes forming a first metal line in an interconnect structure, forming an insulating layer over the interconnect structure, forming a conductive element over the insulating layer, the conductive element extending through the insulating layer to the first metal line, forming a first stop layer extending over the insulating layer and extending over sidewalls and a top surface of the conductive element, forming a second insulating layer over the first stop layer, performing a planarization process on the second insulating layer using the first stop layer as a planarization stop layer, forming a second stop layer over the first stop layer, wherein the second stop layer physically contacts a top surface of the second insulating layer and physically contacts a top surface of the first stop layer, forming a bonding oxide layer over the second stop layer, and forming a first bonding pad in the bonding oxide layer. In an embodiment, after performing the planarization process, a first thickness of the first stop layer over the insulating layer is greater than a second thickness of the first stop layer over the conductive element. In an embodiment, forming a bonding pad in the bonding oxide layer includes etching an opening in the bonding oxide layer using the second stop layer as an etch stop. And etching an opening in the first stop layer to expose the conductive element. In an embodiment, forming a bonding pad in the bonding oxide layer includes etching an opening in the bonding oxide layer to expose the second insulating layer, using the second stop layer as an etch stop. In an embodiment, the method includes extending the opening in the bonding oxide layer through the second insulating layer to expose a second metal line in the interconnect structure.

In an embodiment, a device includes an interconnect structure over a semiconductor substrate, multiple conductive pads over and connected to the interconnect structure, a first etch stop layer over the multiple conductive pads, a dielectric layer over the first etch stop layer and surrounding the conductive pads, a top surface of the dielectric layer coplanar with a top surface of the first etch stop layer, a bonding layer over the first etch stop layer and dielectric layer, and multiple bonding pads in the bonding layer, the multiple bonding pads connected to the multiple conductive pads. In an embodiment, the device includes a second etch stop layer over the first etch stop layer and the dielectric layer. In an embodiment, the material of the second etch stop layer is the same as the material of the first etch stop layer. In an embodiment, the device includes a top package bonded to the multiple bonding pads and to the bonding layer. In an embodiment, the first etch stop layer extends on sidewalls of the conductive pads of the multiple conductive pads. In an embodiment, at least one bonding pad extends from above the multiple conductive pads to below the multiple conductive pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    an interconnect structure over a substrate;
    a plurality of first conductive pads over and connected to the interconnect structure;
    a planarization stop layer extending over the sidewalls and top surfaces of the first conductive pads of the plurality of first conductive pads;
    a surface dielectric layer extending over the planarization stop layer; and
    a plurality of first bonding pads within the surface dielectric layer and connected to the plurality of first conductive pads.

2. The device of claim 1, further comprising an etch stop layer extending over the planarization stop layer, the surface dielectric layer on the etch stop layer.

3. The device of claim 2, further comprising a first dielectric layer between the planarization stop layer and the etch stop layer.

4. The device of claim 2, wherein the plurality of first bonding pads extend through the planarization stop layer and the etch stop layer.

5. The device of claim 1, wherein the planarization stop layer comprises silicon carbide.

6. The device of claim 1, wherein the surface dielectric layer has a thickness between 6 µm and 8 µm.

7. The device of claim 1, further comprising a second dielectric layer between the interconnect structure and the plurality of first conductive pads, wherein the planarization stop layer extends over a top surface of the second dielectric layer.

8. The device of claim 1, further comprising a plurality of second bonding pads within the surface dielectric layer, wherein the second bonding pads are isolated from the interconnect structure.

9. The device of claim 1, wherein the plurality of first conductive pads comprises aluminum.

10. A device, comprising:
an interconnect structure over a semiconductor substrate;
a plurality of conductive pads over and connected to the interconnect structure;
a first etch stop layer over the plurality of conductive pads;
a dielectric layer over the first etch stop layer and surrounding the conductive pads of the plurality of conductive pads, a top surface of the dielectric layer coplanar with a top surface of the first etch stop layer;
a bonding layer over the first etch stop layer and dielectric layer; and
a plurality of bonding pads in the bonding layer, the plurality of bonding pads connected to the plurality of conductive pads.

11. The device of claim 10, further comprising a second etch stop layer over the first etch stop layer and the dielectric layer.

12. The device of claim 11, wherein the material of the second etch stop layer is the same as the material of the first etch stop layer.

13. The device of claim 10, wherein the first etch stop layer extends on sidewalls of the conductive pads of the plurality of conductive pads.

14. A device comprising:
a first metal line in an interconnect structure;
an insulating layer over the interconnect structure;
a conductive element over the insulating layer, the conductive element extending through the insulating layer to the first metal line;
a first stop layer extending over the insulating layer and extending over sidewalls and a top surface of the conductive element;
a second insulating layer over the first stop layer, wherein a top surface of the first stop layer and a top surface of the second insulating layer are coplanar;
a second stop layer over the first stop layer and the second insulating layer, wherein the second stop layer physically contacts the top surface of the second insulating layer and the top surface of the first stop layer;
a bonding oxide layer over the second stop layer; and
a bonding pad in the bonding oxide layer.

15. The device of claim 14, wherein a first thickness of the first stop layer over the insulating layer is greater than a second thickness of the first stop layer over the conductive element.

16. The device of claim 14, wherein the bonding pad extends through the bonding oxide layer, the second stop layer, and the first stop layer to physically contact the conductive element.

17. The device of claim 14, wherein the bonding pad is a dummy bonding pad that extends through the bonding oxide layer and the second stop layer, and physically contacts the second insulating layer.

18. The device of claim 15, wherein the second thickness is in the range of 50 Å to 150 Å.

19. The device of claim 15, wherein a ratio of the first thickness to the second thickness is in the range of 3:1 to 50:1.

20. The device of claim 10, wherein two bonding pads of the plurality of bonding pads physically contact the same conductive pad of the plurality of conductive pads.

* * * * *